(12) United States Patent
Hirota

(10) Patent No.: US 9,661,306 B2
(45) Date of Patent: May 23, 2017

(54) SOLID-STATE IMAGING DEVICE AND CAMERA SYSTEM

(75) Inventor: Isao Hirota, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 727 days.

(21) Appl. No.: 13/981,500

(22) PCT Filed: Feb. 21, 2012

(86) PCT No.: PCT/JP2012/001145
§ 371 (c)(1),
(2), (4) Date: Jul. 24, 2013

(87) PCT Pub. No.: WO2012/117691
PCT Pub. Date: Sep. 7, 2012

(65) Prior Publication Data
US 2013/0307940 A1    Nov. 21, 2013

(30) Foreign Application Priority Data

Feb. 28, 2011  (JP) .................................. 2011-043232
May 24, 2011   (JP) .................................. 2011-115379

(51) Int. Cl.
*H04N 13/02*   (2006.01)
*H04N 5/355*   (2011.01)
(Continued)

(52) U.S. Cl.
CPC ... *H04N 13/0257* (2013.01); *H01L 27/14605* (2013.01); *H01L 27/14621* (2013.01);
(Continued)

(58) Field of Classification Search
None
See application file for complete search history.

(56) References Cited

U.S. PATENT DOCUMENTS

| 5,210,400 | A | * | 5/1993 | Usami | .................... G02B 3/005 |
|           |   |   |        |       | 250/208.1 |
| 5,907,434 | A | * | 5/1999 | Sekine | ................. H04N 5/2259 |
|           |   |   |        |       | 348/335 |

(Continued)

FOREIGN PATENT DOCUMENTS

| CN | 1551364   A | 12/2004 |
| CN | 101262565 A | 9/2008 |

(Continued)

OTHER PUBLICATIONS

International Search Report; International Application No. PCT/JP2012/001145; International Filing Date: Feb. 21, 2012; Completion of the International Search Report: Mar. 13, 2012. (PCT/ISA/210).

(Continued)

*Primary Examiner* — Frederick Bailey
(74) *Attorney, Agent, or Firm* — Michael Best & Friedrich LLP

(57) ABSTRACT

A solid-state imaging device includes: a pixel array section in which a plurality of color pixels are arranged in a matrix form in a first direction and a second direction which is perpendicular to the first direction; and a multi-lens array in which multi-lenses which allow light to be incident on the plurality of color pixels are arranged, wherein in the respective color pixels of the pixel array section, color pixels adjacent in at least one direction of the first direction and the second direction are allocated to a pixel for L in stereo and a pixel for R in stereo, and wherein the multi-lens array is disposed so that at least part of the multi-lens array allows the light to be incident on the adjacent color pixels which are different in color in the first direction.

18 Claims, 16 Drawing Sheets

(51) Int. Cl.
*H04N 5/369* (2011.01)
*H04N 9/04* (2006.01)
*H01L 27/146* (2006.01)

(52) U.S. Cl.
CPC .. *H01L 27/14627* (2013.01); *H01L 27/14641* (2013.01); *H04N 5/35563* (2013.01); *H04N 5/3696* (2013.01); *H04N 9/045* (2013.01); *H04N 13/0217* (2013.01)

(56) References Cited

U.S. PATENT DOCUMENTS

| | | | | |
|---|---|---|---|---|
| 6,583,938 | B1* | 6/2003 | Woodgate | G02B 27/1086 348/E9.027 |
| 9,516,298 | B2* | 12/2016 | Uehara | G02B 27/2214 |
| 2004/0196563 | A1 | 10/2004 | Natori | |
| 2008/0218598 | A1 | 9/2008 | Harada et al. | |
| 2009/0219432 | A1 | 9/2009 | Palum et al. | |
| 2010/0066812 | A1* | 3/2010 | Kajihara | G03B 15/00 348/46 |
| 2010/0141812 | A1* | 6/2010 | Hirota | H04N 9/045 348/279 |

FOREIGN PATENT DOCUMENTS

| | | |
|---|---|---|
| CN | 101753863 A | 6/2010 |
| CN | 101960861 A | 1/2011 |
| JP | 2003-018445 A | 1/2003 |
| JP | 2003-523646 A | 8/2003 |
| JP | 2009-165115 A | 7/2009 |
| JP | 2010-239337 A | 10/2010 |
| JP | 2011-515045 A | 5/2011 |

OTHER PUBLICATIONS

Written Opinion of the International Searching Authority; International Application No. PCT/JP2012/001145; International Filing Date: Feb. 21, 2012; Dated: Mar. 27, 2012. (Form PCT/ISA/220 and PCT/ISA/237).

Extended European Search Report issue Oct. 24, 2014 for corresponding European Application No. 12 75 1776.

Chinese Office Action issued Apr. 1, 2016 for corresponding Chinese Application No. 201280009886.5.

* cited by examiner

BAYER ARRAY

SOLID-STATE IMAGING DEVICE AND CAMERA SYSTEM

TECHNICAL FIELD

The present disclosure relates to a solid-state imaging device and a camera system which are applicable to a stereo camera or a monocular 3D stereo camera which employs a light field technology, for example.

BACKGROUND ART

As a light field camera, a technique disclosed in PTL 1 is known.

In this technique, a color coding (color array) of a color filter is a zigzag array obtained by rotating an RGB Bayer array by 45 degrees, in which four adjacent pixels in the vertical and horizontal directions have the same color. That is, this technique has a color coding in which respective filters of R, G and B are arranged in a square shape in a unit of four pixels of the same color.

Further, one multi-lens array is shared in the unit of four pixels (two pixels up and down×two pixels left and right)

to cover different colors.

Further, in PTL 2, a technique is disclosed in which a parallax and a wide dynamic range (WDR) are used together by differentiating sensitivity of each camera in a multocular 3D camera.

CITATION LIST

Patent Literature

[PTL 1] JP-A-2010-239337
[PTL 2] JP-A-2003-18445

SUMMARY OF INVENTION

Technical Problem

However, in the technique disclosed in JP-A-2010-239337, it is necessary to have a complicated structure and to perform a complicated signal processing, in order to obtain full resolution.

Further, in the technique disclosed in JP-A-2003-18445, since the parallax is not obtained due to saturation in twin lenses, there is a disadvantage such as an insufficient range in the wide dynamic range (WDR).

Accordingly, it is desirable to provide a solid-state imaging device and a camera system which are capable of obtaining a stereo image of a wide dynamic range (WDR) with a monocular arrangement without a complicated structure and complicated signal processing.

Solution to Problem

An embodiment of the present disclosure is directed to a solid-state imaging device including: a pixel array section in which a plurality of color pixels are arranged in a matrix form in a first direction and a second direction which is perpendicular to the first direction; and a multi-lens array in which multi lenses which allow light to be incident on the plurality of color pixels are arranged, wherein in the respective color pixels of the pixel array section, the adjacent color pixels in at least one direction of the first direction and the second direction are allocated to an L pixel and an R pixel for stereo, and wherein the multi-lens array is disposed so that at least part of the multi-lens array allows the light to be incident on the adjacent pixels which are different in color in the first direction.

Another embodiment of the present disclosure is directed to a camera system including: a solid-state imaging device; and an optical system which forms an object image on the solid-state imaging device, wherein the solid-state imaging device includes a pixel array section in which a plurality of color pixels are arranged in a matrix form in a first direction and a second direction which is perpendicular to the first direction, and a multi-lens array in which multi lenses which allow light to be incident on the plurality of color pixels are arranged, wherein in the respective color pixels of the pixel array section, the adjacent color pixels in at least one direction of the first direction and the second direction are allocated to an L pixel and an R pixel for stereo, and wherein the multi-lens array is disposed so that at least part of the multi-lens array allows light to be incident on the adjacent pixels which are different in color in the first direction.

Advantageous Effects of Invention

According to the embodiments of the present disclosure, it is possible to obtain a stereo image of a wide dynamic range (WDR) with a monocular arrangement without a complicated structure and a complicated signal processing.

DESCRIPTION OF EMBODIMENTS

Hereinafter, an embodiment of the present disclosure will be described with reference to the accompanying drawings.

Description will be made in the following order.

1. Configuration example of solid-state imaging device (example of CMOS image sensor)
2. Characteristic configurations of the present embodiment
   2-1. First characteristic configuration example
   2-2. Second characteristic configuration example
   2-3. Third characteristic configuration example
   2-4. Fourth characteristic configuration example
   2-5. Fifth characteristic configuration example
   2-6. Sixth characteristic configuration example
   2-7. Seventh characteristic configuration example
   2-8. Eighth characteristic configuration example
3. Configuration example of applicable monocular 3D stereo camera
4. Configuration example of camera system

1. Configuration Example of Solid-State Imaging Device

[System Configuration]

Figure 1:
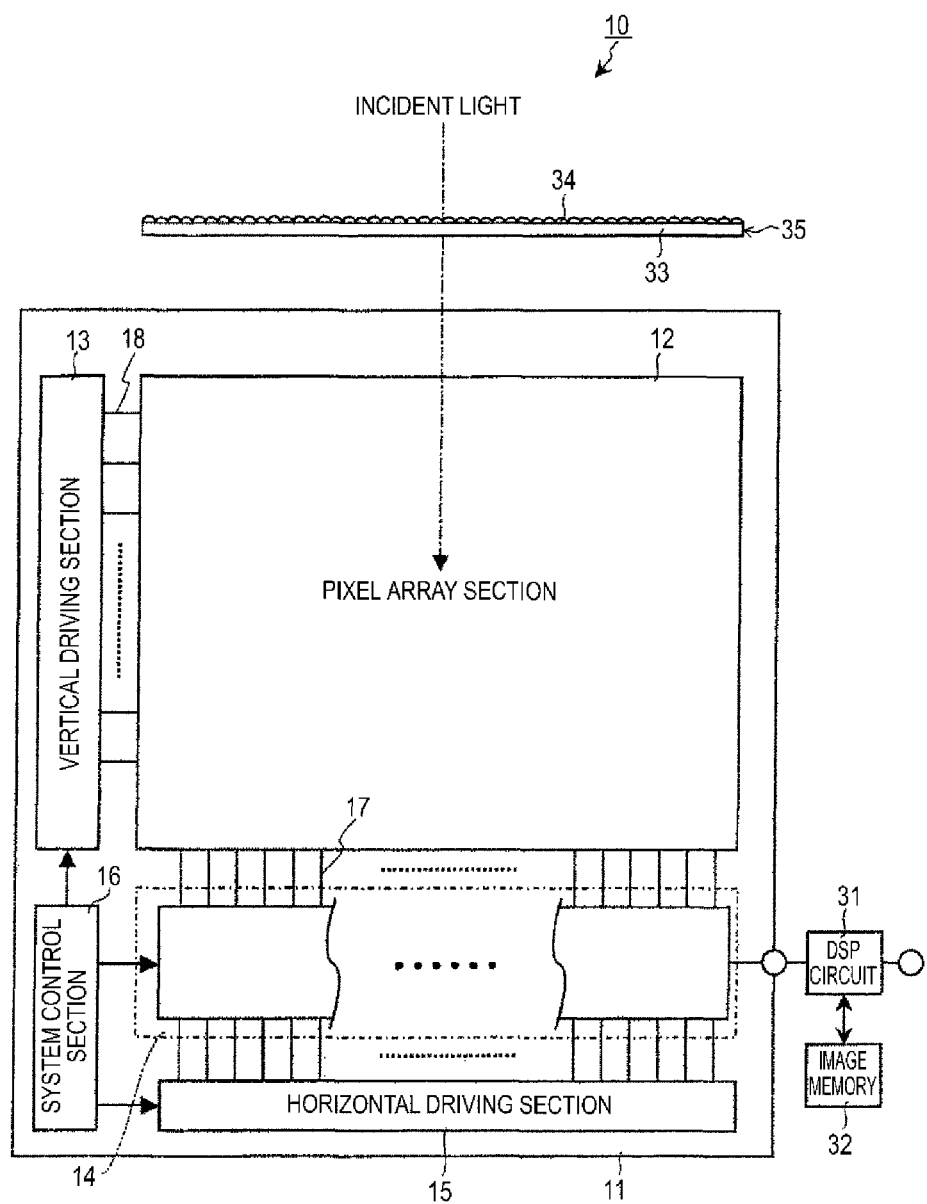
FIG. 1 is a system configuration diagram schematically illustrating a configuration of a solid-state imaging device (CMOS image sensor) according to an embodiment of the present disclosure.

FIG. 1 is a system configuration diagram schematically illustrating a configuration of a CMOS image sensor which is, for example, an X-Y address type solid-state imaging device, according to an embodiment of the present disclosure.

A CMOS image sensor 10 according to the present embodiment includes a pixel array section 12 which is formed on a semiconductor substrate (hereinafter, may be referred to as a "sensor chip") 11, a peripheral circuit section which is integrated on the semiconductor substrate 11 similarly to the pixel array section 12.

As the peripheral circuit section, for example, a vertical driving section 13, a column processing section 14, a horizontal driving section 15, and a system control section 16 are arranged. Further, a DSP (Digital Signal Processor) circuit 31 which forms a signal processing system, and an image memory 32 are disposed outside the sensor chip 11.

Pixel units (not shown) (hereinafter, may be referred to as "pixels"), each of which includes a photoelectric converting device which photoelectrically converts incident visible light into electric charges according to its light intensity, are arranged in an array form in the pixel array section 12.

A specific circuit configuration of the pixel unit will be described later. A color filter array 33 is formed on a light receiving surface (light incident surface) of the pixel array section 12, and a multi-lens array (MLA) 34 is arranged on an upper section side of the color filter array 33. Further, an on-chip lens (OCL) is arranged on the color filter array 33.

Basically, in the present embodiment, as described later, a configuration is employed in which LR parallax separation is performed by the multi-lens array (MLA), as a stereoscopic version of a light field.

Further, in the present embodiment, as described later, it is possible to obtain a WDR image of 3D stereo with a monocular arrangement.

Further, in the pixel array section 12, a pixel drive line 18 is wired along the right and left direction (pixel array direction of a pixel row/horizontal direction) in FIG. 1 for each row and a vertical signal line 17 is formed along the up and down direction in FIG. 1 (pixel array direction of a pixel column/vertical direction) for each column, with respect to the pixel array of a matrix form.

An end of the pixel drive line 18 is connected to an output end of the vertical driving section 13 corresponding to each row. In FIG. 1, one pixel drive line 18 is shown, but the number of the pixel drive lines 18 is not limited to one.

The vertical driving section 13 includes a shift register, an address decoder, and the like. Here, although a specific configuration is not shown, the vertical driving section 13 has a configuration of including a reading scanning system and a resetting scanning system. The reading scanning system sequentially performs a selective scanning in the unit of rows with respect to the pixel unit from which signals are read.

On the other hand, the resetting scanning system performs a resetting scanning of resetting unnecessary charges from the photoelectric converting devices of the pixel unit of a read row, with respect to the read row in which reading scanning is performed by the reading scanning system, prior to the reading scanning by the time of a shutter speed.

By the resetting of the unnecessary charges through the resetting scanning system, a so-called electronic shutter operation is performed.

Here, the electronic shutter operation refers to an operation of discarding optical charges of the photoelectric converting device and newly starting an exposure (accumulation of optical charges).

The signals read by the reading operation through the reading scanning system correspond to the amount of light which is incident after the immediately previous reading operation or the electronic shutter operation.

Further, a period from the reading timing through the immediately previous reading operation or the resetting timing through the electronic shutter operation to the reading timing through the current reading operation becomes the time where optical charges are accumulated in the pixel unit (exposure time).

In the present embodiment, as described later, by employing a device which controls the exposure time or changes transmittance of color filters, it is possible to obtain an image of a wide dynamic range.

The signal output from each unit pixel of the pixel row which is selectively scanned by the vertical driving section 13 is supplied to the column processing section 14 through each of the vertical signal lines 17.

The column processing section 14 performs a signal processing which is determined in advance, with respect to an analog pixel signal which is output from each pixel of the selected row, for each pixel column of the pixel array section 12.

As the signal processing in the column processing section 14, for example, a CDS (Correlated Double Sampling) process is used.

The CDS process is a process of receiving a reset level and a signal level output from each pixel of the selected row, obtaining signals of pixels corresponding to one row by obtaining a level difference between them, and removing fixed pattern noise of the pixels.

It is possible for the column processing section 14 to have an A/D converting function of digitalizing an analog pixel signal.

The horizontal driving section 15 includes a shift register, an address decoder, and the like, and sequentially and selectively scans circuit portions corresponding to the pixel rows of the column processing section 14.

By the selective scanning through the horizontal driving section 15, the pixel signals which are signal-processed for each pixel row by the column processing section 14 are sequentially output to the outside of the sensor chip 11.

That is, the pixel signals corresponding to the color coding (color array) of the color filter array 33 are output as raw data from the sensor chip 11.

The system control section 16 receives a clock, data instructing an operation mode, or the like which is given from the outside of the sensor chip 11, and outputs data such as internal information of the CMOS image sensor 10.

The system control section 16 has a dynamic generator which generates a variety of dynamic signals and performs a drive control of the vertical driving section 13, the column processing section 14, the horizontal driving section 15 and the like on the basis of the variety of dynamic signals generated by the dynamic generator.

The DSP circuit 31 which is an external circuit of the sensor chip 11 temporarily stores image data corresponding to one frame, for example, which is output from the sensor chip 11 in the image memory 32, and performs a demosaicing process or the like on the basis of the pixel information which is stored in the image memory 32.

Here, the demosaicing process is a process of complementing color information by collecting sufficient color information from signals of peripheral pixels and assigning the collected color information to a signal of each pixel having only monochromic color information, to create a full color image.

(Circuit Configuration of Unit Pixel)

Figure 2:
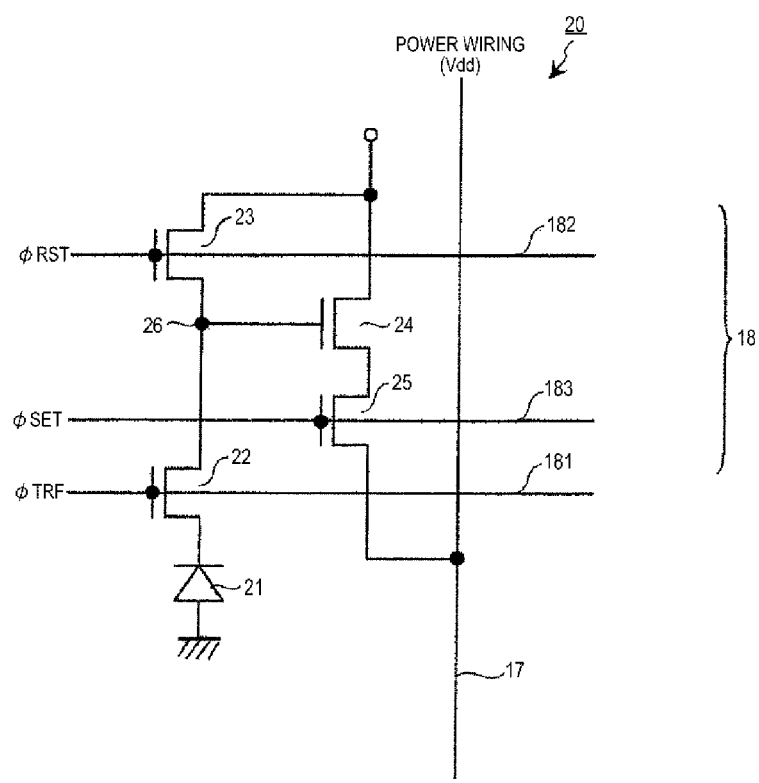
FIG. 2 is a circuit diagram illustrating an example of a circuit configuration of a unit pixel.

FIG. 2 is a circuit diagram illustrating an example of a circuit configuration of a unit pixel 20.

As shown in FIG. 2, the unit pixel 20 according to the present embodiment includes a photoelectric converting device, namely, a photodiode 21, and four transistors of a transfer transistor 22, a reset transistor 23, an amplification transistor 24 and a selection transistor 25, for example.

Here, as the four transistors 22 to 25, for example, an N channel MOS transistor is used. However, the conductive combination of the transfer transistor 22, the reset transistor 23, the amplification transistor 24 and the selection transistor 25, as mentioned above, is only an example, and the present embodiment is not limited to the combination.

As the pixel drive line 18, for example, three drive lines of a transfer line 181, a reset line 182 and a selection line 183 are commonly wired to each pixel of the same pixel row, with respect to the pixel unit 20.

Each one end of the transfer line 181, the reset line 182 and the selection line 183 is connected to an output end of the vertical driving section 13 corresponding to each pixel row, in the unit of pixel rows.

The photodiode 21 includes an anode electrode which is connected to negative supply (for example, ground), and photoelectrically converts received light into optical charges (here, photoelectrons) of the amount of charges corresponding to the light amount.

A cathode electrode of the photodiode 21 is electrically connected to a gate electrode of the amplification transistor 24 through the transfer transistor 22.

A node 26 which is electrically connected to the gate electrode of the amplification transistor 24 is referred to as an "FD (floating diffusion)" section.

The transfer transistor 22 is connected between the cathode electrode of the photodiode 21 and the FD section 26.

A transfer pulse φTRF in which a high level (for example, Vdd level) is active (hereinafter, referred to as "high active") is assigned to a gate electrode of the transfer transistor 22 through the transfer line 181.

As the transfer pulse ΦTRF is assigned, the transfer transistor 22 is turned on to transfer the optical charges which are electrically converted by the photodiode 21 to the FD section 26.

The reset transistor 23 includes a drain electrode which is connected to the pixel power Vdd and a source electrode which is connected to the FD section 26.

Before transfer of the signal charges to the FD section 26 from the photodiode 21, a reset pulse φRST of high active is assigned to a gate electrode of the reset transistor 23 through the reset line 182.

As the reset pulse ΦRST is assigned, the reset transistor 23 is turned on to discard the charges of the FD section 26 to the pixel power Vdd, thereby resetting the FD section 26.

The amplification transistor 24 includes a gate electrode which is connected to the FD section 26 and a drain electrode which is connected to the pixel power Vdd.

Further, the amplification transistor 24 outputs an electric potential of the FD section 26 after being reset by the reset transistor 23 as a reset signal (reset level) Vreset.

The amplification transistor 24 outputs the electric potential of the FD section 26 after the signal charges are transferred by the transfer transistor 22 as a light accumulation signal (signal level) Vsig.

The selection transistor 25 includes, for example, a drain electrode which is connected to a source electrode of the amplification transistor 24 and a source electrode which is connected to the vertical signal line 17.

A selection pulse φSEL of high active is assigned to a gate electrode of the selection transistor 25 through the selection line 183.

As the selection pulse φSEL is assigned, the selection transistor 25 is turned on to set the unit pixel 20 to a selection state, and to relay the signal output from the amplification transistor 24 to the vertical signal line 17.

It is possible to employ a circuit configuration in which the selection transistor 25 is connected between the pixel power Vdd and the drain of the amplification transistor 24.

Further, the unit pixel 20 is not limited to the configuration of including the above-described four transistors.

For example, a pixel configuration including three transistors in which the amplification transistor 24 and the selection transistor 25 are shared may be used, and any configuration of pixel circuit may be used.

(Pixel Addition)

However, in moving image capturing, in order to increase the frame rate and to realize high speed moving image capturing, pixel addition of adding signals of a plurality of adjacent pixels for reading is generally performed.

The pixel addition may be performed in a pixel, on the vertical signal line 17, in the column processing section 14, in a subsequent signal processing section, or the like.

Here, as an example, a pixel configuration in a case where signals of four pixels adjacent in the vertical and horizontal directions in a square array of 2×2, for example, are added in a pixel will be described.

Figure 3:
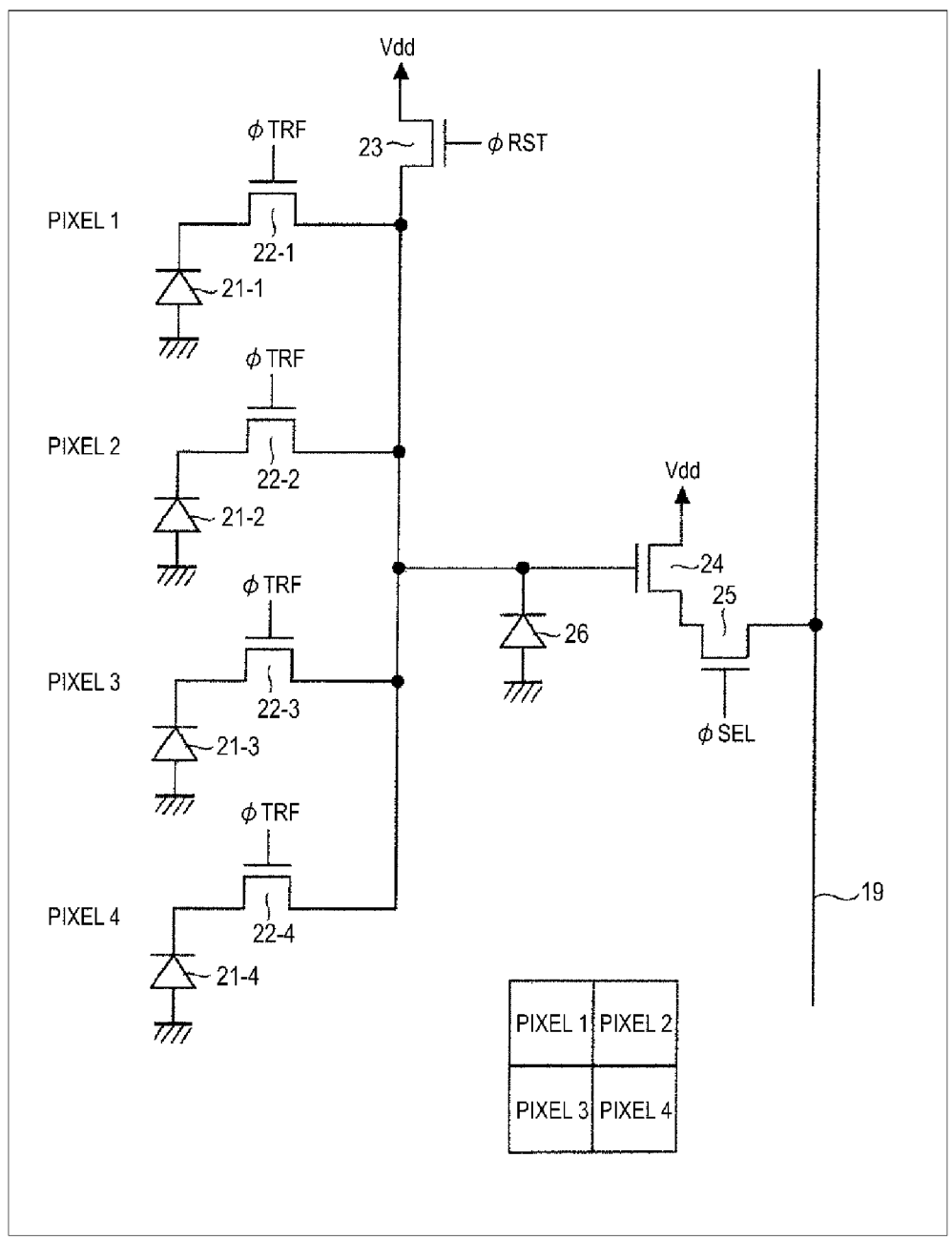
FIG. 3 is a circuit diagram illustrating an example of a circuit configuration in a case where four adjacent pixels addition is performed in a pixel.

FIG. 3 is a circuit diagram illustrating an example of a circuit configuration in a case where four adjacent pixel addition is performed in a pixel. Same reference numerals are given in the figure to the same sections as in FIG. 2.

In FIG. 3, the photodiodes 21 of four adjacent pixels in the vertical and horizontal directions are referred to as photodiodes 21-1, 21-2, 21-3 and 21-4.

With respect to the photodiodes 21-1, 21-2, 21-3, and 21-4, four transfer transistors 22-1, 22-2, 22-3, and 22-4 are installed, and the reset transistor 23, the amplification transistor 24 and the selection transistor 25 are respectively installed.

That is, in the transfer transistors 22-1, 22-2, 22-3, and 22-4, one electrode thereof is connected to each cathode electrode of the photodiodes 21-1, 21-2, 21-3, and 21-4, and the other electrode thereof is commonly connected to the gate electrode of the amplification transistor 24.

The FD section 26 which is common to the photodiodes 21-1, 21-2, 21-3, and 21-4 is electrically connected to the gate electrode of the amplification transistor 24.

The reset transistor 23 includes a drain electrode which is connected to the pixel power Vdd and a source electrode which is connected to the FD section 26.

In the above pixel configuration corresponding to the four adjacent pixel addition, by assigning the transfer pulse φTRF to the four transfer transistors 22-1, 22-2, 22-3, and 22-4 at the same timing, it is possible to realize pixel addition between the four adjacent pixels.

That is, signal charges transferred to the FD section 26 from the photodiodes 21-1, 21-2, 21-2, 21-3, and 21-4 by the transfer transistors 22-1, 22-2, 22-3, and 22-4 are added in the FD section 26 (may be referred to as "FD addition").

On the other hand, by assigning the transfer pulse φTRF to the transfer transistors 22-1, 22-2, 22-3, and 22-4 at different timings, it is possible to realize signal output in the unit of pixel.

That is, it is possible to enhance the frame rate by performing the pixel addition in moving image capturing, while it is possible to enhance the resolution by independently reading all pixel signals in still image capturing.

<Pixel Array>

As described above, the pixel array section 12 includes the plurality of pixels which are arranged in the matrix form.

Figure 4:
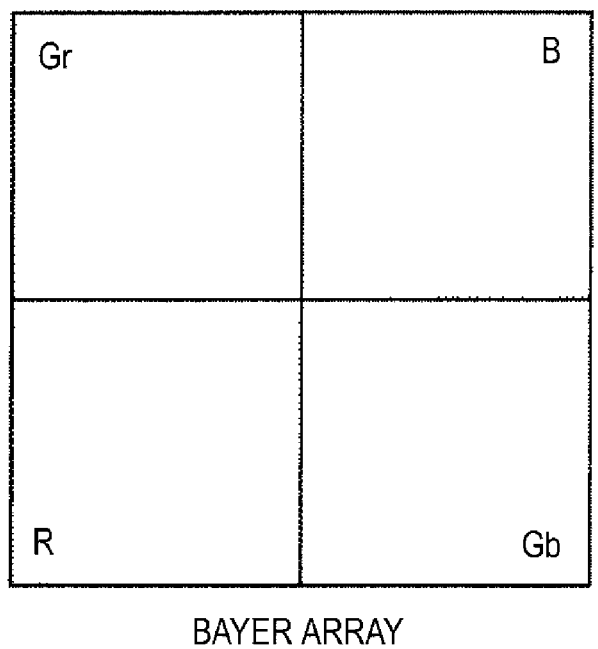
FIG. 4 is a diagram illustrating a Bayer array as an example of a pixel array.

The pixel array section 12 employs, for example, the Bayer array as shown in FIG. 4 as the pixel array.

In the pixel array section 12 according to the present embodiment, one pixel is divided into a plurality of divided pixel cells DPCs each including a photoelectric converting device formed by a hotodiode, for example.

Specifically, in the solid-state imaging device (CMOS image sensor) 10, one pixel under the same color filter of the Bayer array is divided into the plurality of divided DPCs of two or more. In this case, the two or more of pixel cells DPCs which are different in sensitivity and accumulation time can be divided by changing the sensitivity or accumulation time (exposure time).

Hereinafter, a case where one pixel DPC is divided into four divided pixel cells DPC-A to DPC-D will be described as an example.

Figure 5:
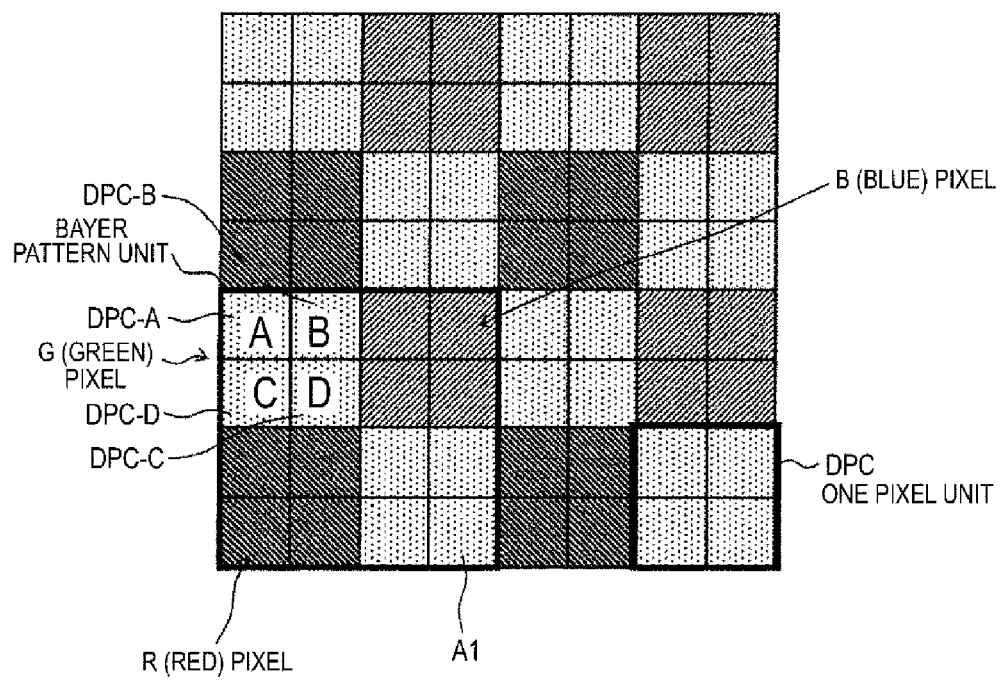
FIG. 5 is a conceptual diagram illustrating a pixel division according to the embodiment of the present disclosure.

FIG. 5 is a conceptual diagram illustrating pixel division according to the present embodiment.

In FIG. 5, a division method in the case of the Bayer array is shown. In an example in which one pixel under the same color filter is divided into four, for example, the sensitivities and accumulation time are different from each other in the respective divided pixels.

In FIG. 5, as an example, a case where a G (green) pixel PCG is divided into four pixels of DPC-A, DPC-B, DPC-C, and DPC-D is shown. For example, it is possible to divide the G pixel PCG into two pixels of DPC-A and DPC-B.

2. Characteristic Configuration of the Present Embodiment

In the present embodiment, the CMOS image sensor 10 of the above configuration is formed as a solid-state imaging device which can be applied to a stereo camera or a monocular 3D stereo camera which employs a light field technology.

Hereinafter, characteristic configurations of the solid-state imaging device which can be applied to the stereo camera or the monocular 3D stereo camera will be described in detail.

Hereinafter, in the X-Y coordinates shown in the figures, the X direction represents a first direction, the Y direction represents a second direction. Further, the X direction may be referred to as the horizontal direction or transverse direction, and the Y direction may be referred to as the vertical direction or longitudinal direction.

2-1. First Characteristic Configuration Example

Figure 6:
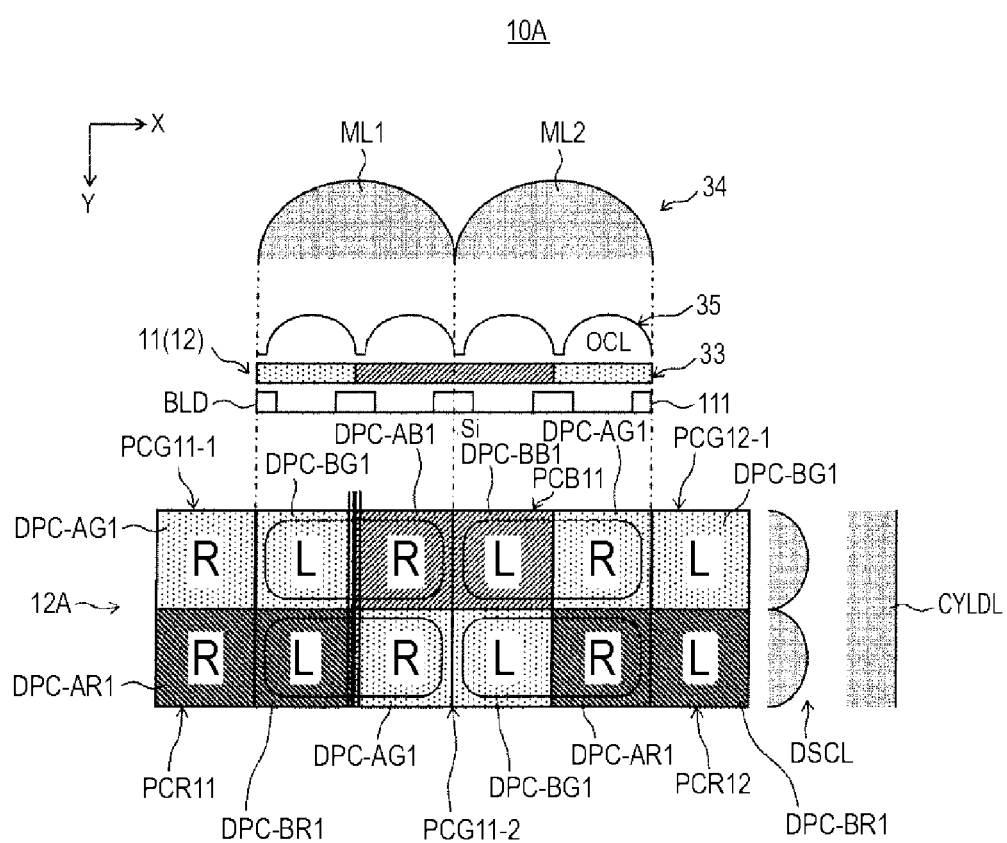
FIG. 6 is a diagram illustrating a first characteristic configuration example of a solid-state imaging device (CMOS image sensor) according to the embodiment of the present disclosure.

FIG. 6 is a diagram illustrating a first characteristic configuration example of the solid-state imaging device (CMOS image sensor) according to the present embodiment.

A CMOS image sensor 10A in FIG. 6 can be applied to a stereo camera, and performs LR parallax separation by the multi-lens array 34 as a stereo version of a light field.

In this configuration, the horizontal resolution becomes ½, but it is usefully matched with a side-by-side recording system.

Here, L represents the left in stereo, and R represents the right in stereo.

In the CMOS image sensor 10A, a pixel array section 12A employs a division method of each pixel in the case of the Bayer array.

In FIG. 6, the color filter array 33 is formed so that a G pixel PCG11-1, an R pixel PCR11, a G pixel PCG11-2, and a B pixel PCB11 have the Bayer array of 2×2. This array is formed in a matrix form.

In the example of FIG. 6, an example in which a G pixel PCG12-1 of an adjacent Bayer array is disposed adjacent to the B pixel PCB11 in the transverse direction, and an R pixel PCR12 of an adjacent Bayer array is disposed adjacent to the G pixel PCG11-2 in the transverse direction is partially shown.

In the example of FIG. 6, the G pixel PCG11-1, the B pixel PCB11, and the G pixel PCG12-1 are disposed in the first row, and the R pixel PCR11, the G pixel PCG11-2, and the R pixel PCR12 are disposed in the second row.

Further, in the example of FIG. 6, the G pixel PCG11-1, the R pixel PCR11, the G pixel PCG11-2, and the B pixel PCB11 are respectively divided into two in the transverse direction (X direction).

The G pixel PCG11-1 includes two divided pixels of DPC-AG1 and DPC-BG1. In this example, the divided pixel DPC-AG1 is allocated for R in stereo, and the divided pixel DPC-BG1 is allocated for L in stereo.

The R pixel PCR11 includes two divided pixels of DPC-AR1 and DPC-BR1. In this example, the divided pixel DPC-AR1 is allocated for R in stereo, and the divided pixel DPC-BR1 is allocated for L in stereo.

The B pixel PCB11 includes two divided pixels of DPC-AB1 and DPC-BB1. In this example, the divided pixel DPC-AB1 is allocated for R in stereo, and the divided pixel DPC-BB1 is allocated for L in stereo.

The G pixel PCG11-2 includes two divided pixels of DPC-AG1 and DPC-BG1. In this example, the divided pixel DPC-AG1 is allocated for R in stereo, and the divided pixel DPC-BG1 is allocated for L in stereo.

The G pixel PCG12-1 includes two divided pixels of DPC-AG1 and DPC-BG1. In this example, the divided pixel DPC-AG1 is allocated for R in stereo, and the divided pixel DPC-BG1 is allocated for L in stereo.

The R pixel PCR12 includes two divided pixels of DPC-AR1 and DPC-BR1. In this example, the divided pixel DPC-AR1 is allocated for R in stereo, and the divided pixel DPC-BR1 is allocated for L in stereo.

In this example, the same R and L functions for stereo are allocated to the respective divided pixels of the same column of the pixel array (array in the Y direction).

In other words, the R and L functions for stereo are alternately allocated to the respective divided pixels of the same row of the pixel array (array in the X direction).

As shown in FIG. 6, a light shielding section BLD or a wiring is formed on the semiconductor substrate 11, and the color filter array 33 is formed thereon. Further, the on-chip lens (OCL) array 35 is formed on the color filter array 33.

Respective on-chip lenses OCLs of the on-chip lens array 35 are formed in a matrix form so as to correspond to the respective divided pixels in the pixel array section 12A.

Further, the multi-lens array 34 in which multi-lenses ML are formed in a matrix form is disposed, facing the light incident side of the on-chip lens array 35.

In the example of FIG. 6, the colors of pixels which are shared in the transverse direction (X direction) of the respective multi-lenses ML of the multi-lens array 34 are disposed so as not to be the same color but different colors, differently from a normal array.

In the example of FIG. 6, a first multi-lens system ML1 and a second multi-lens system ML2 are shown.

The first multi-lens system ML1 is disposed to be shared by the divided pixel DPC-BG1 for L in stereo of the G pixel PCG11-1 and the divided pixel DPC-AB1 for R in stereo of the B pixel PCB11 adjacent to the G pixel PCG11-1, in the first row.

Similarly, the first multi-lens system ML1 is disposed to be shared by the divided pixel DPC-BR1 for L in stereo of the R pixel PCR11 and the divided pixel DPC-AG1 for R in stereo of the G pixel PCB11-2 adjacent to the R pixel PCR11, in the second row.

The second multi-lens system ML2 is disposed to be shared by the divided pixel DPC-BB1 for L in stereo of the B pixel PCB11 and the divided pixel DPC-AG1 for R in stereo of the G pixel PCG12-1 adjacent to the B pixel PCB11, in the first row.

Similarly, the second multi-lens system ML2 is disposed to be shared by the divided pixel DPC-BG1 for L in stereo of the G pixel PCG11-2 and the divided pixel DPC-AR1 for R in stereo of the R pixel PCR12 adjacent to the G pixel PCG11-2, in the second row.

In this way, by setting the color pixels shared by one multi-lens ML to be different in color, it is possible to improve the mixed color (extinction ratio) of L and R in stereo by the lens gap and different color separation.

Further, it is possible to select a discrete lens DSCL or a cylindrical lens CYLDL in the longitudinal direction (Y direction).

In a case where the on-chip lens OCL is not present, by using the discrete lens DSCL, it is possible to enhance the light focusing ratio.

In the example of FIG. 6, the lens shape over two divided pixels is a flat shape which is long in the transverse direction (X direction) in order to prevent influence on the lens of the shared divided pixels which are adjacent to each other in the longitudinal direction (Y direction).

2-2. Second Characteristic Configuration Example

Figure 7:
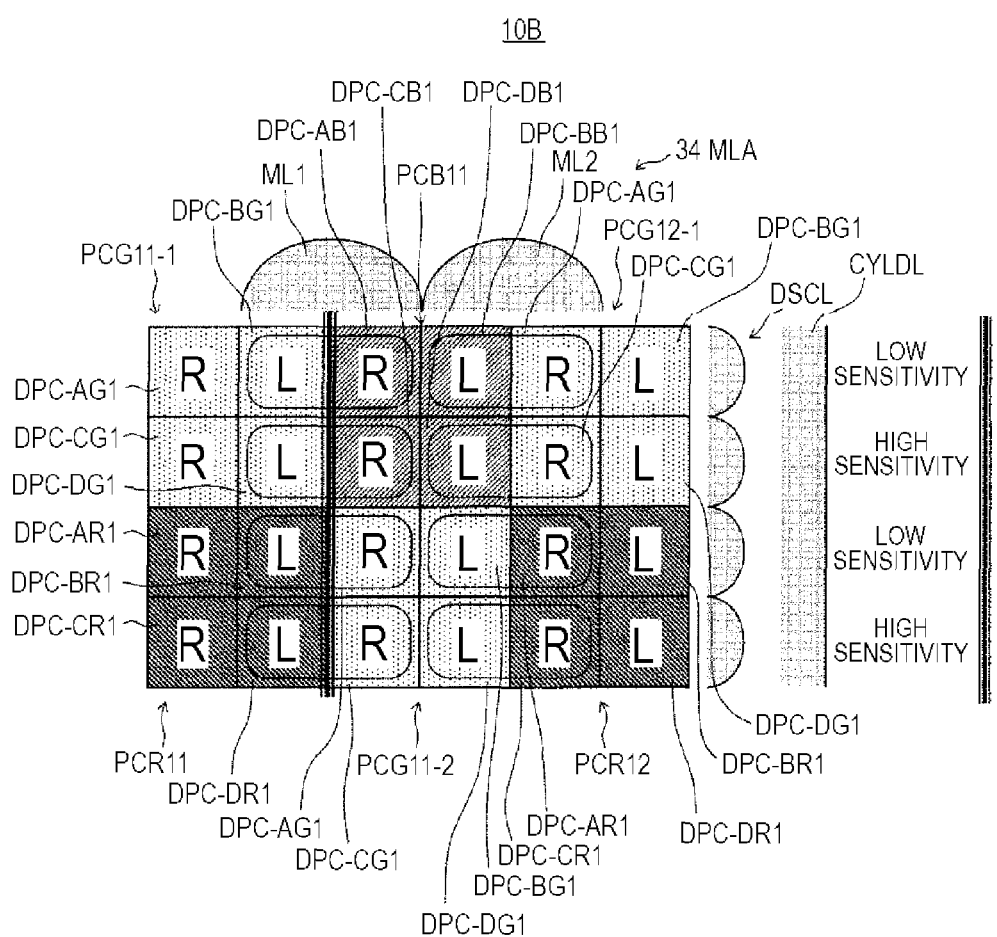
FIG. 7 is a diagram illustrating a second characteristic configuration example of a solid-state imaging device (CMOS image sensor) according to the embodiment of the present disclosure.

FIG. 7 is a diagram illustrating a second characteristic configuration example of the solid-state imaging device (CMOS image sensor) according to the present embodiment.

A CMOS image sensor 10B in FIG. 7 is different from the CMOS image sensor 10A in FIG. 6 as follows.

In the CMOS image sensor 10B in FIG. 7, each pixel is not divided into two pixels but is divided into four pixels of 2×2, as shown in FIG. 5, and the same color filter is also disposed in the longitudinal (up and down) direction to distribute two conditions of the parallax and wide dynamic range (WDR) by four pixels of the same color.

With such a configuration, the CMOS image sensor 10B can be applied to a monocular 3D stereo camera of a wide dynamic range (WDR) on the basis of the Bayer array.

As described above, in the example of FIG. 7, the G pixel PCG11-1, the R pixel PCR11, the G pixel PCG11-2, and the B pixel PCB11 are respectively divided into four of 2×2 in the transverse direction (X direction) and the longitudinal direction (Y direction).

The G pixel PCG11-1 includes four divided pixels of DPC-AG1, DPC-BG1, DPC-CG1 and DPC-DG1. In this example, the divided pixel DPC-AG1 is allocated for R in stereo, and the divided pixel DPC-BG1 is allocated for L in stereo. The divided pixel DPC-CG1 is allocated for R in stereo, and the divide pixel DPC-DG1 is allocated for L in stereo.

The R pixel PCR11 includes four divided pixels of DPC-AR1, DPC-BR1, DPC-CR1, and DPC-DR1. In this example, the divided pixel DPC-AR1 is allocated for R in stereo, and the divided pixel DPC-BR1 is allocated for L in stereo. The divided pixel DPC-CR1 is allocated for R in stereo, and the divided pixel DPC-DR1 is allocated for L in stereo.

The B pixel PCB11 includes four divided pixels of DPC-AB1, DPC-BB1, DPC-CB1, and DPC-DB1. In this example, the divided pixel DPC-AB1 is allocated for R in stereo, and the divided pixel DPC-BB1 is allocated for L in stereo. The divided pixel DPC-CB1 is allocated for R in stereo, and the divided pixel DPC-DB1 is allocated for L in stereo.

The G pixel PCG11-2 includes four divided pixels of DPC-AG1, DPC-BG1, DPC-CG1, and DPC-CG1. In this example, the divided pixel DPC-AG1 is allocated for R in stereo, and the divided pixel DPC-BG1 is allocated for L in stereo. The divided pixel DPC-CG1 is allocated for R in stereo, and the divided pixel DPC-DG1 is allocated for L in stereo.

The G pixel PCG12-1 includes four divided pixels of DPC-AG1, DPC-BG1, DPC-CG1, and DPC-DG1. In this example, the divided pixel DPC-AG1 is allocated for R in stereo, and the divided pixel DPC-BG1 is allocated for L in stereo. The divided pixel DPC-CG1 is allocated for R in stereo, and the divided pixel DPC-DG1 is allocated for L in stereo.

The R pixel PCR12 includes four divided pixels of DPC-AR1, DPC-BR1, DPC-CR1, and DPC-DR1. In this example, the divided pixel DPC-AR1 is allocated for R in stereo, and the divided pixel DPC-BR1 is allocated for L in stereo. The divided pixel DPC-CR1 is allocated for R in stereo, and the divided pixel DPC-DR1 is allocated for L in stereo.

Also in this example, the same R and L functions for stereo are allocated to the respective divided pixels of the same column of the pixel array (array in the Y direction).

In other words, the R and L functions for stereo are alternatively allocated to the respective divided pixels of the same row of the pixel array (array in the X direction).

In FIG. 7, the portion of the semiconductor substrate 11 is omitted for simplicity, and only the multi-lens array 34 is shown.

Also in this example, the colors of pixels which are shared in the transverse direction (X direction) of the respective multi-lenses ML of the multi-lens array 34 are disposed so as not to be the same color but different colors, differently from a normal array.

Also in the example of FIG. 7, the first multi-lens system ML1 and the second multi-lens system ML2 are shown.

The first multi-lens system ML1 is disposed to be shared by the divided pixel DPC-BG1 for L in stereo of the G pixel PCG11-1 and the divided pixel DPC-AB1 for R in stereo of the B pixel PCB11 adjacent to the G pixel PCG11-1, in the first row.

The first multi-lens system ML1 is disposed to be shared by the divided pixel DPC-DG1 for L in stereo of the G pixel PCR11-1 and the divided pixel DPC-CB1 for R in stereo of the B pixel PCB11 adjacent to the G pixel PCR11-1, in the second row.

The first multi-lens system ML1 is disposed to be shared by the divided pixel DPC-BR1 for L in stereo of the R pixel PCB11 and the divided pixel DPC-AG1 for R in stereo of the G pixel PCG11-2 adjacent to the R pixel PCR11, in the third row.

The first multi-lens system ML1 is disposed to be shared by the divided pixel DPC-DR1 for L in stereo of the R pixel PCR11 and the divided pixel DPC-CG1 for R in stereo of the G pixel PCG11-2 adjacent to the R pixel PCR11, in the fourth row.

The second multi-lens system ML2 is disposed to be shared by the divided pixel DPC-BB1 for L in stereo of the B pixel PCB11 and the divided pixel DPC-AG1 for R in stereo of the G pixel PCG12-1 adjacent to the B pixel PCB11, in the first row.

The second multi-lens system ML2 is disposed to be shared by the divided pixel DPC-DB1 for L in stereo of the B pixel PCB11 and the divided pixel DPC-CG1 for R in stereo of the G pixel PCG12-1 adjacent to the B pixel PCB11, in the second row.

The second multi-lens system ML2 is disposed to be shared by the divided pixel DPC-BG1 for L in stereo of the G pixel PCG11-2 and the divided pixel DPC-AB1 for R in stereo of the R pixel PCR12 adjacent to the G pixel PCG11-2, in the third row.

The second multi-lens system ML2 is disposed to be shared by the divided pixel DPC-DG1 for L in stereo of the G pixel PCG11-2 and the divided pixel for R in stereo DPC-CR1 of the R pixel PCR12 adjacent to the G pixel PCG11-2, in the fourth row.

In this way, in a similar way to the example of FIG. 6, in the example of FIG. 7, by setting the color pixels shared by one multi-lens ML to be different in color, it is possible to improve the mixed color (extinction ratio) of L and R in stereo by the lens gap and different color separation.

Further, it is possible to select a discrete lens DSCL or a cylindrical lens CYLDL in the longitudinal direction (Y direction).

In a case where the on-chip lens OCL is not present, by using the discrete lens DSCL, it is possible to enhance the light focusing ratio.

Also in the example of FIG. 7, the lens shape over two divided pixels is a flat shape which is long in the transverse direction (X direction) in order to prevent influence on the lens of the shared divided pixels which are adjacent to each other in the longitudinal direction (Y direction).

Further, in the example of FIG. 7, in order to obtain a wide dynamic range, it is configured that the respective rows in the pixel row array alternately become low and high in sensitivity.

As the configuration of the low sensitivity pixels and the high sensitivity pixels to obtain the wide dynamic range, it is possible to employ both of an exposure control by a shutter or the like and a device structure for changing transmittance of the color filter.

The CMOS image sensor 10B can be applied to a face camera or the like of a mobile electronic apparatus such as a mobile phone. In the face camera of a mobile electronic apparatus, since the sky is inserted as a background and the face is in a close distance, it is optimal to obtain a WDR image with a monocular arrangement.

In the mobile electronic apparatus, the CMOS image sensor 10B can be applied to a user interface (UI) through depth information.

2-3. Third Characteristic Configuration Example

Figure 8:
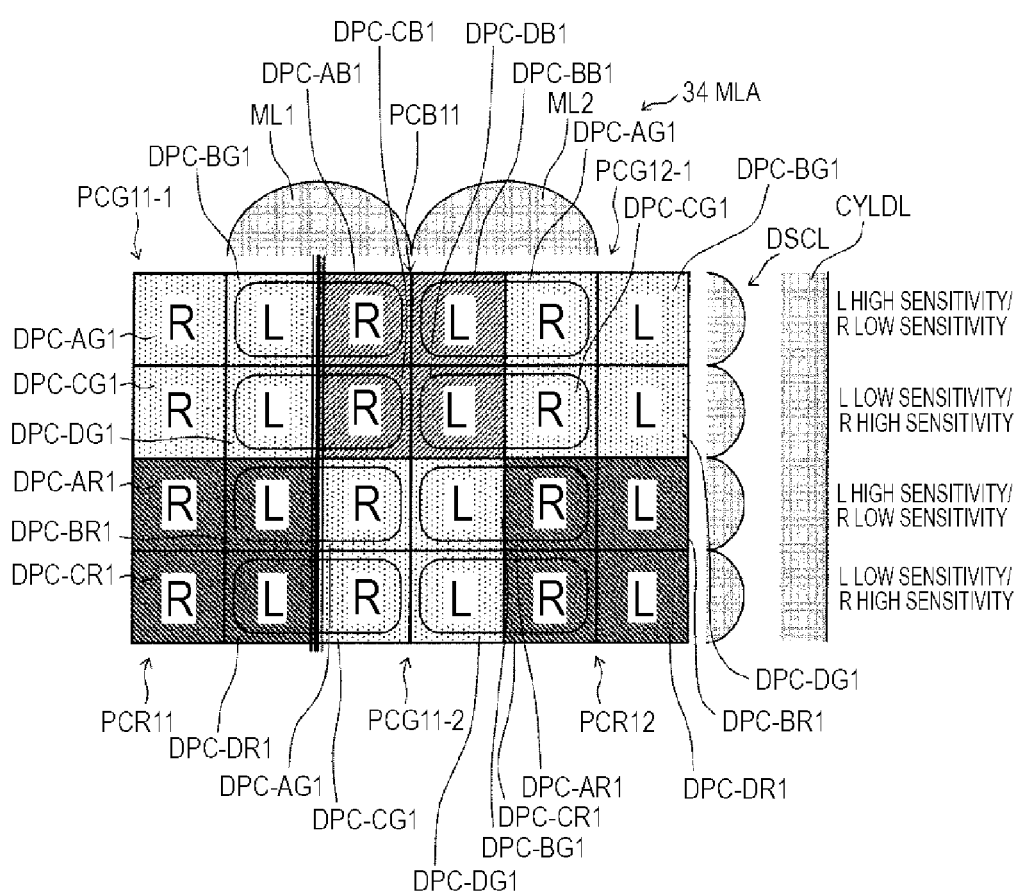
FIG. 8 is a diagram illustrating a third characteristic configuration example of a solid-state imaging device (CMOS image sensor) according to the embodiment of the present disclosure.

FIG. 8 is a diagram illustrating a third characteristic configuration example of the solid-state imaging device (CMOS image sensor) according to the present embodiment.

A CMOS image sensor 10C in FIG. 8 is different from the CMOS image sensor 10B in FIG. 7 as follows.

In the CMOS image sensor 10C, instead of alternately setting the respective rows to the low sensitivity and the high sensitivity, L pixels and R pixels are set to the low sensitivity and the high sensitivity in each row, and the sensitivities of L pixels and R pixels are switched for each row.

In the first row, the L divided pixels correspond to the high sensitivity and the R divided pixels correspond to the low sensitivity.

In the second row, the L divided pixels correspond to the low sensitivity and the R divided pixels correspond to the high sensitivity.

In the third row, the L divided pixels correspond to the high sensitivity and the R divided pixels correspond to the low sensitivity.

In the fourth row, the L divided pixels correspond to the low sensitivity and the R divided pixels correspond to the high sensitivity.

In the example of FIG. 8, since the centers of combined images of low sensitivity LR images and high sensitivity LR images of the respect colors coincide with each other in the middle thereof, the linearity of a space phase at the time of WDR is maintained, to thereby hardly affect the resolution.

2-4. Fourth Characteristic Configuration Example

Figure 9:
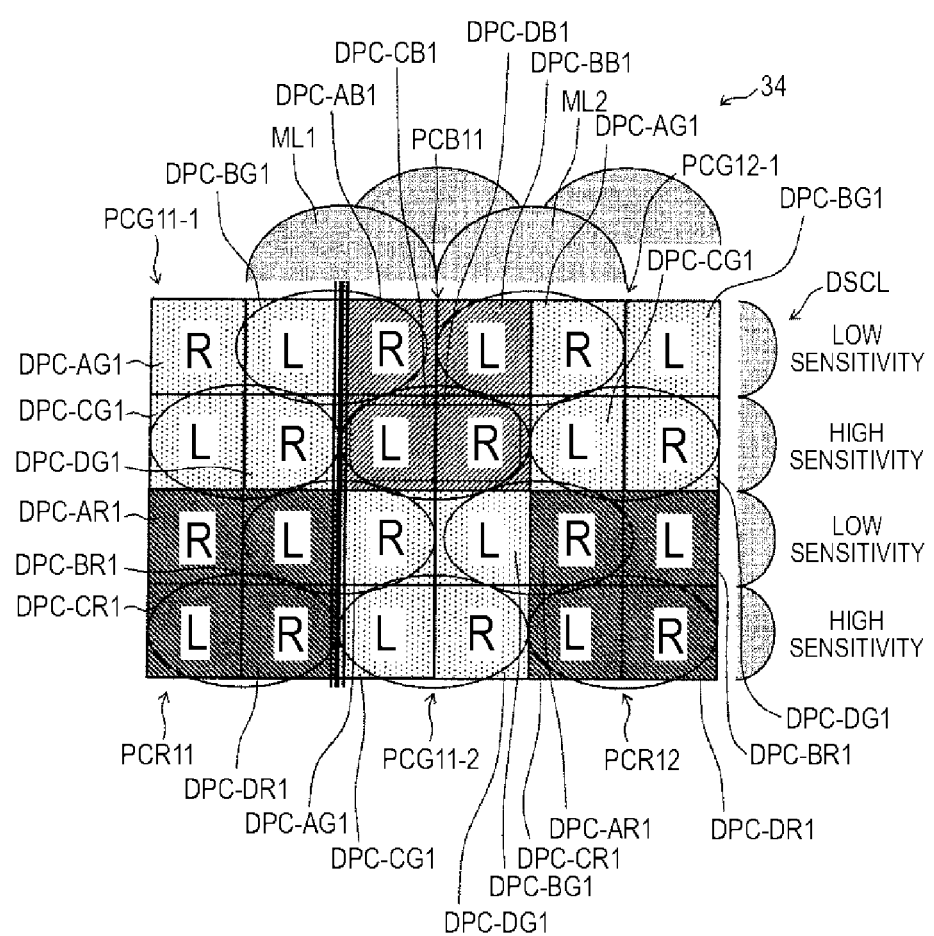
FIG. 9 is a diagram illustrating a fourth characteristic configuration example of a solid-state imaging device (CMOS image sensor) according to the embodiment of the present disclosure.

FIG. 9 is a diagram illustrating a fourth characteristic configuration example of the solid-state imaging device (CMOS image sensor) according to the present embodiment.

A CMOS image sensor 10D in FIG. 9 is different from the CMOS image sensor 10B in FIG. 7 in that the L pixel and the R pixel are switched each row.

In the G pixel PCG11-1, the divided pixel DPC-AG1 is allocated for R in stereo, and the divided pixel DPC-BG1 is allocated for L in stereo. The divided pixel DPC-CG1 is allocated for L in stereo, and the divided pixel DPC-DG1 is allocated for R in stereo.

In the R pixel PCR11, the divided pixel DPC-AR1 is allocated for R in stereo, and the divided pixel DPC-BR1 is allocated for L in stereo. The divided pixel DPC-CR1 is allocated for L in stereo, and the divided pixel DPC-DR1 is allocated for R in stereo.

In the B pixel PCB11, the divided pixel DPC-AB1 is allocated for R in stereo, and the divided pixel DPC-BB1 is allocated for L in stereo. The divided pixel DPC-CB1 is allocated for L in stereo, and the divided pixel DPC-DB1 is allocated for R in stereo.

In the G pixel PCG11-2, the divided pixel DPC-AG1 is allocated for R in stereo, and the divided pixel DPC-BG1 is allocated for L in stereo. The divided pixel DPC-CG1 is allocated for L in stereo, and the divided pixel DPC-DG1 is allocated for R in stereo.

In the G pixel PCG12-1, the divided pixel DPC-AG1 is allocated for R in stereo, and the divided pixel DPC-BG1 is allocated for L in stereo. The divided pixel DPC-CG1 is allocated for L in stereo, and the divided pixel DPC-DG1 is allocated for R in stereo.

In the R pixel PCR12, the divided pixel DPC-AR1 is allocated for R in stereo, and the divided pixel DPC-BR1 is allocated for L in stereo. The divided pixel DPC-CR1 is allocated for L in stereo, and the divided pixel DPC-DR1 is allocated for R in stereo.

In the example of FIG. 9, since L and R deviate from each other by a half cycle in the adjacent shared divided pixels in the longitudinal direction (Y direction), a region where the multi-lens ML can be disposed is enlarged, and thus, it is possible to make the shape of the multi-lens ML close to around shape instead of a flat shape, and thereby easily form the lens.

2-5. Fifth Characteristic Configuration Example

Figure 10:
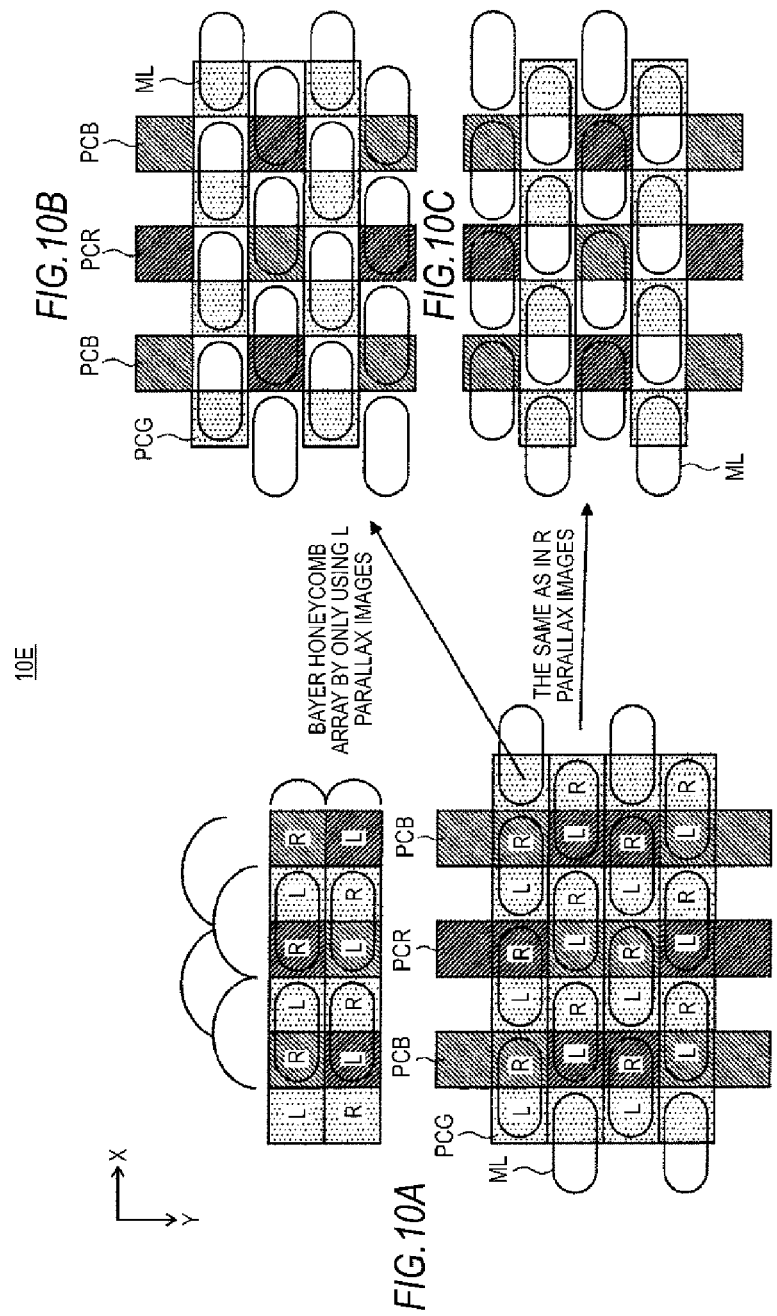
FIGS. 10A to 10C are diagrams illustrating a fifth characteristic configuration example of a solid-state imaging device (CMOS image sensor) according to the embodiment of the present disclosure.

FIGS. 10A to 10C are diagrams illustrating a fifth characteristic configuration example of a solid-state imaging device (CMOS image sensor) according to the present embodiment.

The characteristic of a CMOS image sensor 10E of FIGS. 10A to 10C is basically a square array (rectangular array) instead of a zigzag array, and the L pixel and the R pixel are switched each row.

In the CMOS image sensor 10E, in addition to the fact that the L pixel and the R pixel are switched each row, the first column, the third column, the fifth column and the seventh column are G pixel stripes of only G pixels.

Further, the multi-lens ML is disposed so that each G pixel PCG serves as the L pixel or the R pixel in stereo in cooperation with the R pixel PCR or the B pixel PCB which are adjacent in the X direction.

Here, the G pixel is represented as the reference sign PCG, the B pixel is represented as the reference sign PCB, and the R pixel is represented as the reference sign PCR, for simplicity.

In this configuration, the colors of pixels which are shared in the transverse direction (X direction) of the respective multi-lenses ML of the multi-lens array 34 are disposed so as not to be the same color but different colors, differently from a normal array.

In the example of FIG. 10A, the G pixel PCG in the second row and the fourth row which are even rows is allocated as a pixel (divided pixel) for L in stereo.

On the other hand, the B pixel PCB or the R pixel PCR which shares the multi-lens ML with the G pixel PCG is allocated as a pixel (divided pixel) for R in stereo.

In the example of FIG. 10A, the G pixel PCG in the third row and the fifth row which are odd rows is allocated as a pixel (divided pixel) for R in stereo.

On the other hand, the B pixel PCB or the R pixel PCR which shares the multi-lens ML with the G pixel PCG is allocated as a pixel (divided pixel) for L in stereo.

On the basis of the pixel array shown in FIG. 10A, for example, as shown in FIG. 10B, it is possible to realize a so-called Bayer honeycomb (zigzag) array by using only the L parallax pixels.

Further, on the basis of the pixel array shown in FIG. 10A, for example, as shown in FIG. 10C, it is possible to realize a so-called Bayer honeycomb array by using only the R parallax pixels.

In the above-described configurations, the 2D zigzag Bayer array is obtained by adding the L pixel and the R pixel in the Y direction. In this case, since the addition is performed in the same vertical signal line, the addition process becomes easy.

Also in the example of FIGS. 10A to 10C, by setting the color pixels shared by one multi-lens ML to be different in color, it is possible to improve the mixed color (extinction ratio) of L and R in stereo by the lens gap and different color separation.

Further, in the example of FIGS. 10A to 10C, since L and R deviate from each other by a half cycle in the shared divided pixels adjacent in the longitudinal direction (Y direction), a region where the multi-lens ML can be disposed is enlarged, and thus, it is possible to make the shape of the multi-lens ML close to a round shape instead of a flat shape, and thereby easily form the lens.

2-6. Sixth Characteristic Configuration Example

Figure 11:
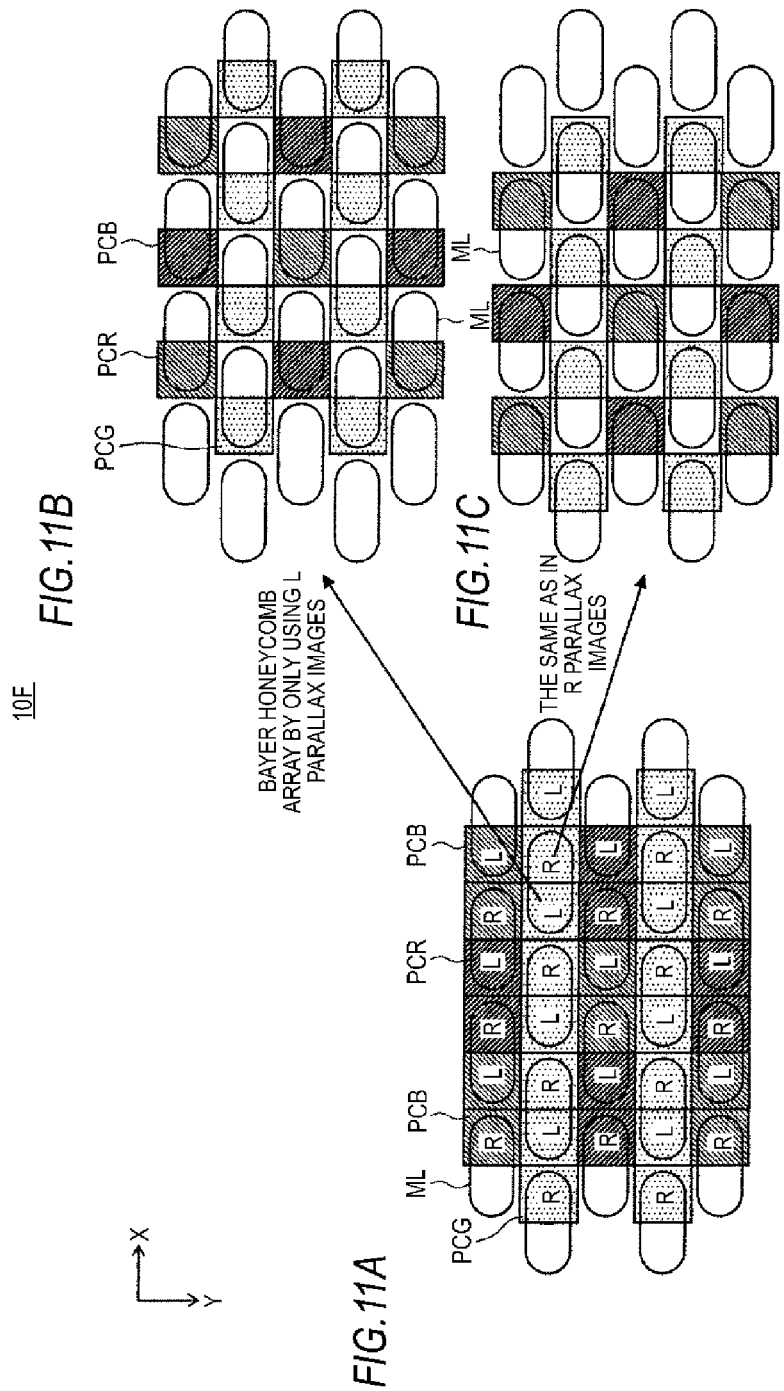
FIGS. 11A to 11C are diagrams illustrating a sixth characteristic configuration example of a solid-state imaging device (CMOS image sensor) according to the embodiment of the present disclosure.

FIGS. 11A to 11C are diagrams illustrating a sixth characteristic configuration example of a solid-state imaging device (CMOS image sensor) according to the present embodiment.

A CMOS image sensor 10F of FIGS. 11A to 11C basically has a square array (rectangular array) instead of a zigzag array, and the L pixel and the R pixel are switched each row.

In the CMOS image sensor 10F, in addition to the fact that the L pixel and the R pixel are switched each row, the second row and the fourth row are G pixel stripes of only G pixels.

Further, the multi-lens ML is disposed so that each G pixel PCG serves as the L pixel or the R pixel in stereo in cooperation with the R pixel PCR or the B pixel PCB adjacent in the X direction.

Here, the G pixel is represented as the reference sign PCG, the B pixel is represented as the reference sign PCB, and the R pixel is represented as the reference sign PCR, for simplicity.

In this configuration, in the first row, the third row and the fifth row, the colors of pixels which are shared in the transverse direction (X direction) of the respective multi-lenses ML of the multi-lens array 34 are disposed so as not to be the same color but different colors, differently from a normal array.

That is, in the first row, the third row, and the fifth row, the B pixel PCB and the R pixel PCR which are adjacent to each other in the X direction share the multi-lens ML. Here, one is allocated as a pixel (divided pixel) for L in stereo, and the other is allocated as a pixel (divided pixel) for R in stereo.

Further, in the second and fourth rows, the adjacent G pixels PCG of the same color share the multi-lens ML. Here, one is allocated as a pixel (divided pixel) for L in stereo, and the other is allocated as a pixel (divided pixel) for R in stereo.

On the basis of the pixel array shown in FIG. 11A, for example, as shown in FIG. 11B, it is possible to realize a so-called Bayer honeycomb (zigzag) array by using only the L parallax pixels.

Further, on the basis of the pixel array shown in FIG. 11A, for example, as shown in FIG. 11C, it is possible to realize a so-called Bayer honeycomb array by using only the R parallax pixels.

Also in the example of FIGS. 11A to 11C, by setting the color pixels shared by one multi-lens ML to be different in color, it is possible to improve the mixed color (extinction ratio) of L and R in stereo by the lens gap and different color separation.

Further, in the example of FIGS. 11A to 11C, since L and R deviate from each other by a half cycle in the shared divided pixels adjacent in the longitudinal direction (Y direction), a region where the multi-lens ML can be disposed is enlarged, and thus, it is possible to make the shape of the multi-lens ML close to a round shape instead of a flat shape, and thereby easily form the lens.

Also in the example of FIGS. 11A to 11C, since L and R deviate from each other by a half cycle in the shared divided pixels adjacent in the longitudinal direction (Y direction), a region where the multi-lens ML can be disposed is enlarged, and thus, it is possible to make the shape of the multi-lens ML close to a round shape instead of a flat shape, and thereby easily form the lens.

2-7. Seventh Characteristic Configuration Example

Figure 12:
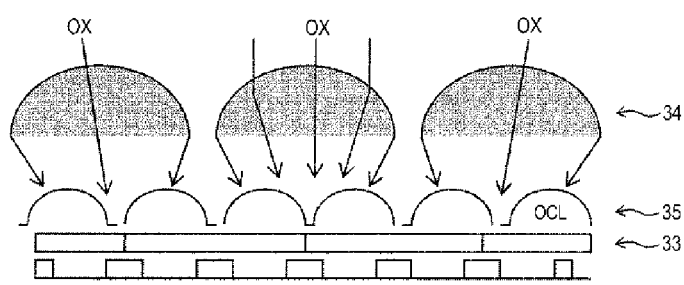
FIG. 12 is a diagram illustrating a seventh characteristic configuration example of a solid-state imaging device (CMOS image sensor) according to the embodiment of the present disclosure.

FIG. 12 is a diagram illustrating a seventh characteristic configuration example of a solid-state imaging device (CMOS image sensor) according to the present embodiment.

In a CMOS image sensor 10G in FIG. 12, a pupil correction of the on-chip lens OCL and the multi-lens array (MLA) 34 can be performed according to the change in an optical axis (OX), in order to improve the mixed color (extinction ratio) of the L pixel and the R pixel.

2-8. Eighth Characteristic Configuration Example

Figure 13:
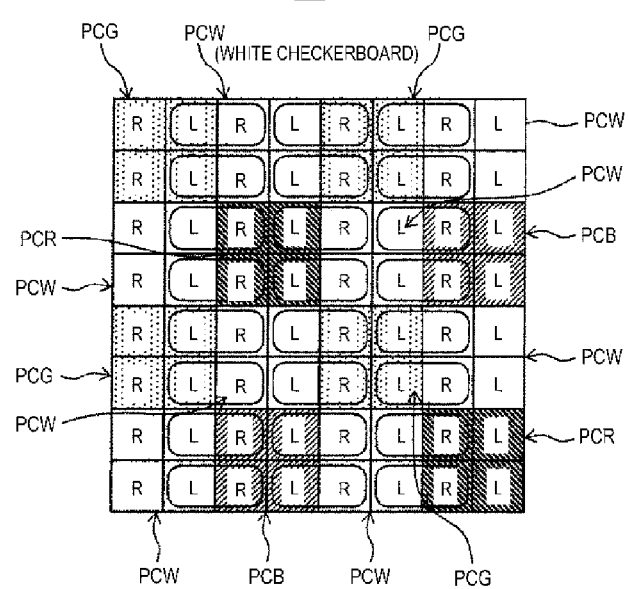
FIG. 13 is a diagram illustrating an eighth characteristic configuration example of a solid-state imaging device (CMOS image sensor) according to the embodiment of the present disclosure.

FIG. 13 is a diagram illustrating an eighth characteristic configuration example of a solid-state imaging device (CMOS image sensor) according to the present embodiment.

A CMOS image sensor 10H in FIG. 13 shows that a pixel array using white pixels PCW instead of the Bayer array may be employed.

Here, the white pixels are also included in the color pixels.

3. Configuration Example of Applicable Monocular 3D Stereo Camera

Figure 14:
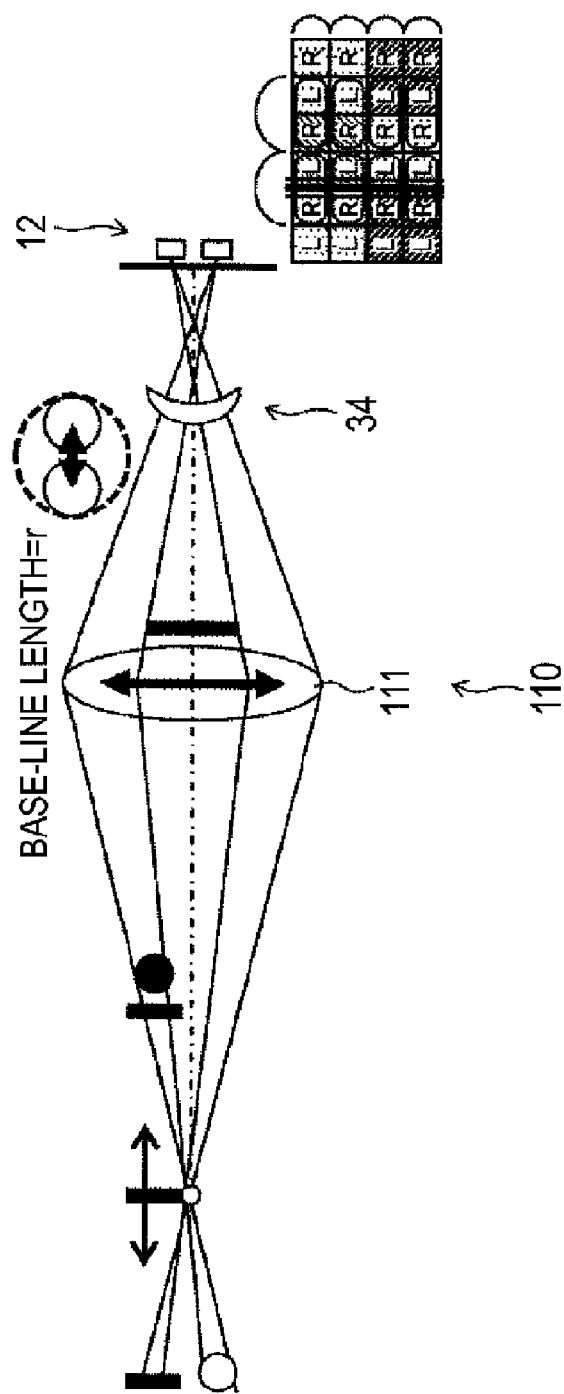
FIG. 14 is a diagram illustrating a configuration example of a monocular 3D stereo camera to which the solid-state imaging device (CMOS image sensor) according to the embodiment of the present disclosure is applied.

FIG. 14 is a diagram illustrating a configuration example of a monocular 3D stereo camera to which a solid-state imaging device (CMOS image sensor) according to the present embodiment is applied.

A monocular 3D stereo camera 100 basically includes an optical system 110 having an image forming lens 111 on the object side of the multi-lens array 34.

A zoom lens may be disposed in the optical system 110.

As described above, according to the present embodiment, the following effects may be obtained.

According to the present embodiment, as the stereo version of the light field, the LR parallax separation is performed by the multi-lens array 34.

Further, by at least partially setting the color pixels shared by one multi-lens ML to be different in color, it is possible to improve the mixed color (extinction ratio) of L and R in stereo by the lens gap and different color separation.

Further, two conditions of the parallax and wide dynamic range are distributed among four pixels of the same color. Thus, assuming that recording information may be reduced to ¼, by using one condition for the WDR of low sensitivity and high sensitivity and using the other condition for the LR parallax with respect to the Quad type sensor of the same color four pixels array, it is possible to obtain WDR images in stereo in a monocular manner.

That is, according to the present embodiment, it is possible to obtain wide dynamic range (WDR) images in stereo in a monocular manner without a complicated structure and a complicated signal processing.

Further, it is possible to achieve both the wide dynamic range (WDR) and the LR parallax with low costs.

Figure 15:
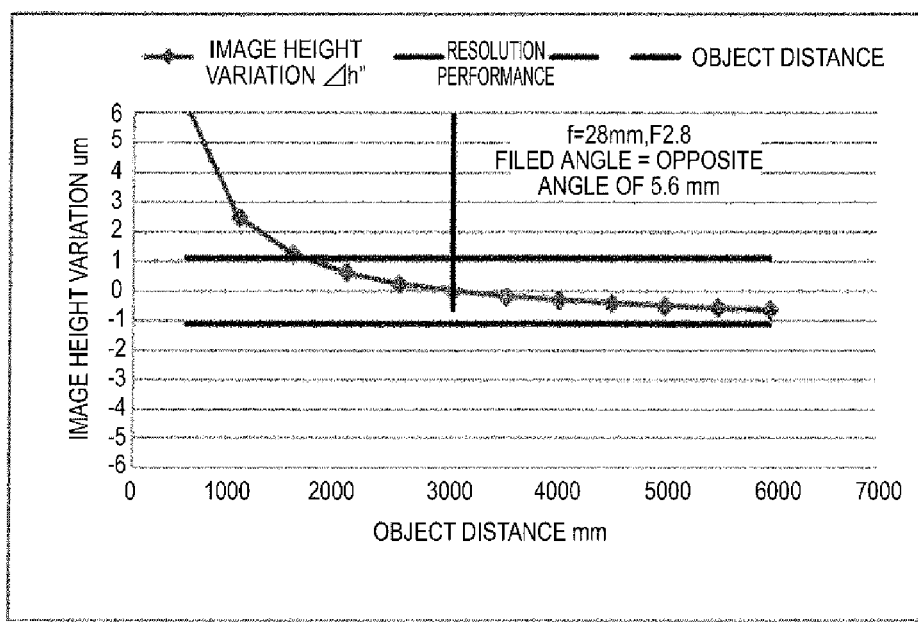
FIG. 15 is a diagram illustrating object distance dependency of image height variation in a monocular 3D stereo camera to which the solid-state imaging device (CMOS image sensor) according to the embodiment of the present disclosure is applied.

FIG. 15 is a diagram illustrating object distance dependency of image height variation in a monocular 3D stereo camera to which a solid-state imaging device (CMOS image sensor) according to the present embodiment is applied.

In FIG. 15, the transverse axis represents the object distance (mm), and the longitudinal axis represents the image height variation (µm), respectively.

In this case, the object distance dependency of the image height variation in a focus point of 3 m is shown.

It is indicated that if the object distance is not within 1.5 m even in a fine pixel pitch of 1.12 µm, a separation characteristic of the parallax images is not preferable in this camera.

Accordingly, the monocular 3D stereo camera on which the solid-state imaging device according to the present embodiment is mounted is suitable for short distance photographing in stereo application.

Accordingly, as described above, the monocular 3D stereo camera is optimal for the face camera of the mobile electronic device.

Figure 16:
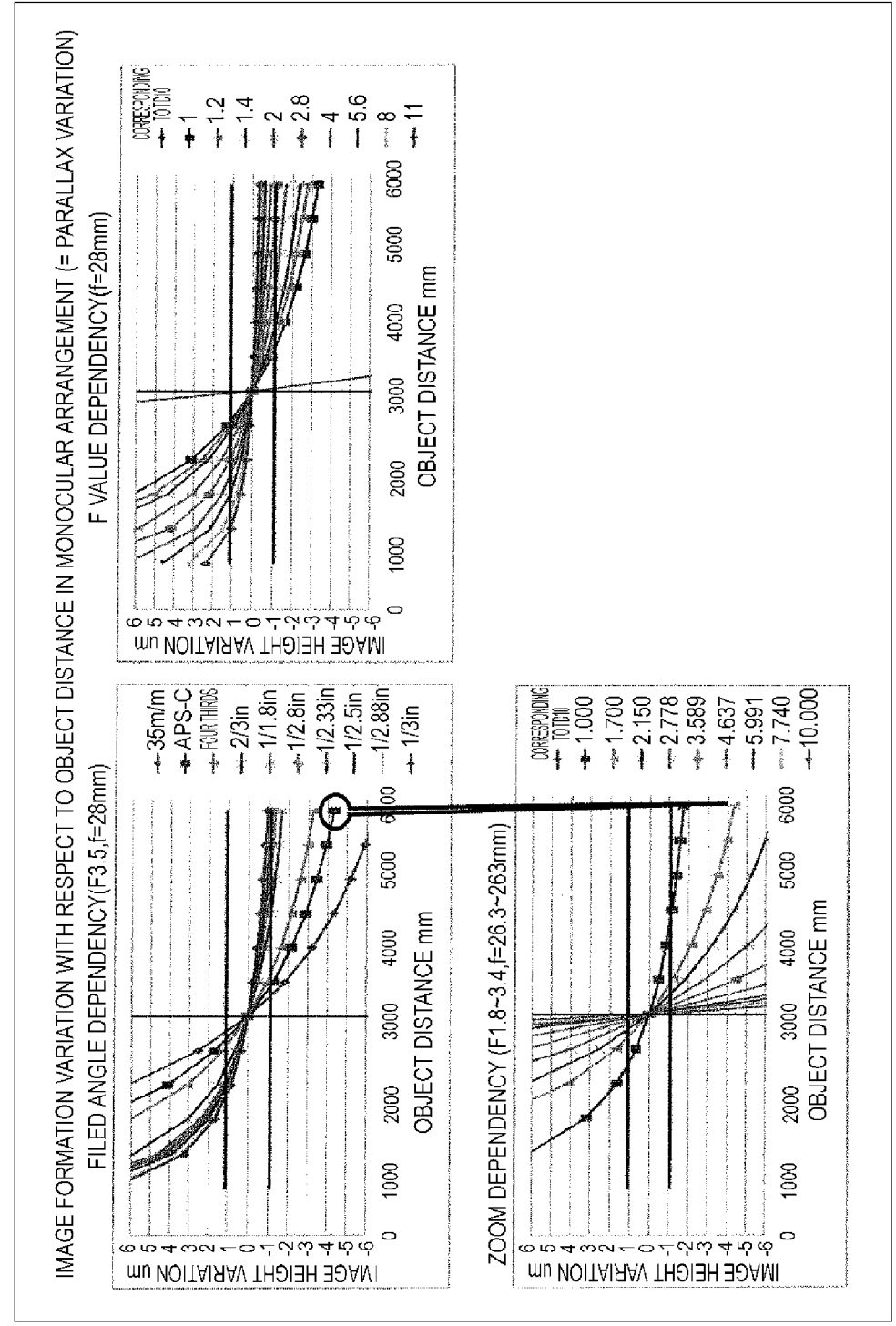
FIG. 16 shows diagrams illustrating image formation variation with respect to an object distance in a monocular 3D stereo camera to which the solid-state imaging device (CMOS image sensor) according to the embodiment of the present disclosure is applied.

FIG. 16 shows diagrams illustrating image formation variations with respect to object distances in a monocular 3D stereo camera to which a solid-state imaging device (CMOS image sensor) according to the present embodiment is applied.

In FIG. 16, the transverse axis represents the object distance (mm) and the longitudinal axis represents the image height variation (µm), respectively.

The upper left diagram in FIG. 16 represents the field angle dependency, the upper right diagram in FIG. 16 represents the F value dependency, and the lower left diagram in FIG. 16 represents the zoom dependency, respectively.

Here, in a wide angle where the extinction ratio is ∞ and a focal distance f is about 28 mm, an oval monocular parallax of 3⁄2 inches or less does not become 3 m or more.

It can be understood that zoom is most effective in the example of FIG. 16.

In the present embodiment, the pixel array has been described as a square array, but a checkerboard array in which the RGB Bayer array or the like is rotated by 45 degrees may be employed.

The solid-state imaging device having the above-described effects may be applied as an imaging device of a digital camera or a video camera.

4. Configuration Example of Camera System

Figure 17:
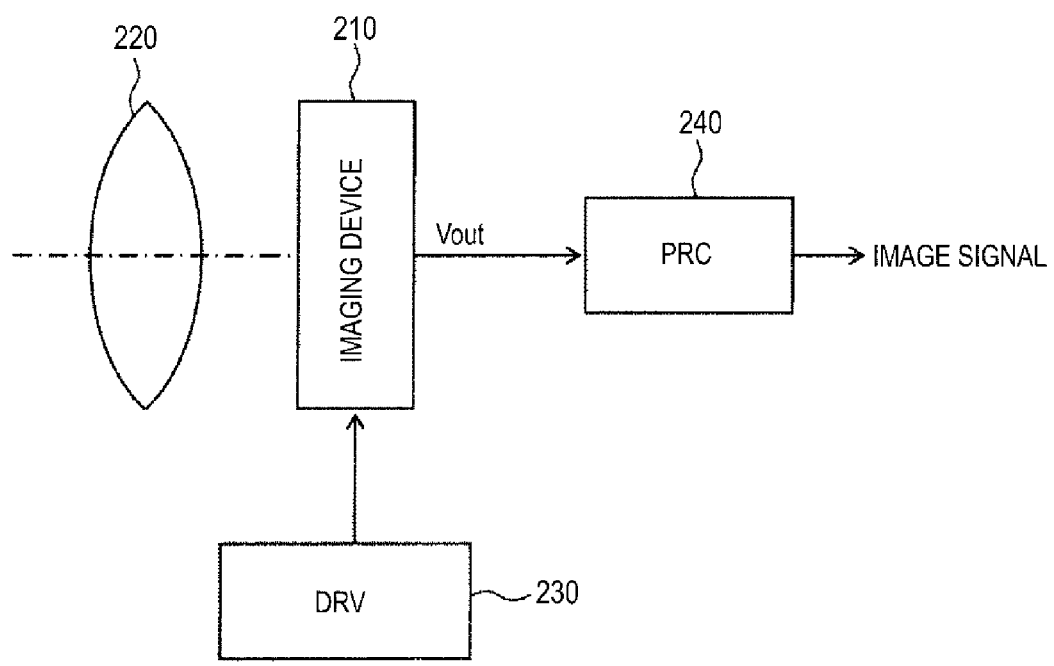
FIG. 17 is a diagram illustrating an example of a configuration of a camera system to which the solid-state imaging device according to the embodiment of the present disclosure is applied.

FIG. 17 is a diagram illustrating a configuration example of a camera system to which the solid-state imaging device according to the present embodiment is applied.

As shown in FIG. 17, a camera system 200 includes an imaging device 210 to which the CMOS image sensor (solid-state imaging device) 10, 10A, 10B, 10C, 10D, 10F, 10G or 10H according to the present embodiment can be applied.

The camera system 200 includes an optical system which guides incident light to the pixel area of the imaging device 210 (forms an object image), such as a lens 220 which forms an image of the incident light (image light) on an imaging surface.

The camera system 200 includes a drive circuit (DRV) 230 which drives the imaging device 210, and a signal processing circuit (PRC) 240 which processes an output signal of the imaging device 210.

The drive circuit 230 includes a timing generator (not shown) which generates a variety of timing signals including start pulses or clock pulses which drive circuits in the imaging device 210, and drives the imaging device 210 by a predetermined timing signal.

Further, the signal processing circuit 240 performs a predetermined signal processing with respect to the output signal of the imaging device 210.

The image signal processed by the signal processing circuit 240 is recorded on a recording medium such as a memory. The image information recorded on the recording medium is hard-copied by a printer or the like. Further, the image signal processed by the signal processing circuit 240 is displayed as a moving image on a monitor including a liquid crystal display or the like.

As described above, in the imaging apparatus such as a digital still camera, as the above-described solid-state imaging devices 10, 10A, 10B, 10C, 10D, 10F, 10G or 10H is mounted as the imaging device 210, it is possible to achieve a camera of high accuracy with low power consumption.

The present disclosure may have the following configurations.

(1) A solid-state imaging device including:
a pixel array section in which a plurality of color pixels are arranged in a matrix form in a first direction and a second direction which is perpendicular to the first direction; and
a multi-lens array in which multi lenses which allow light to be incident on the plurality of color pixels are arranged,
wherein in the respective color pixels of the pixel array section, color pixels adjacent in at least one direction of the first direction and the second direction are allocated to a pixel for L in stereo and a pixel for R in stereo, and
wherein the multi-lens array is disposed so that at least part of the multi-lens array allows the light to be incident on the adjacent pixels which are different in color in the first direction.

(2) The solid-state imaging device according to (1),
wherein the plurality of adjacent pixels or one pixel of the pixel array section includes a plurality of divided pixels which are regions whose light sensitivities or amounts of accumulated charges are different from each other,
wherein the respective divided pixels are allocated to the pixel for L in stereo and the pixel for R in stereo, and
wherein the multi-lens array is disposed so that at least part of the multi-lens array allows the light to be incident on the adjacent divided pixels which are different in color in the first direction.

(3) The solid-state imaging device according to (2),
wherein the plurality of divided pixels are formed in at least the first direction, and
wherein the adjacent divided pixels are allocated to the pixel for L in stereo and the pixel for R in stereo.

(4) The solid-state imaging device according to (3),
wherein the color pixels include the plurality of divided pixels which are arranged in a square shape in the first direction and the second direction, and
wherein the color pixels are formed so that the color pixels of low sensitivity and the color pixels of high sensitivity are alternately arranged in respective rows of the matrix-formed arrangement of the color pixels.

(5) The solid-state imaging device according to (3) or (4),
wherein the divided pixels are allocated to become the same pixels for L or R in stereo in the same column and are allocated to become the same pixels for R or L in stereo in an adjacent column, in the matrix-formed arrangement of the color pixels.

(6) The solid-state imaging device according to (4),
wherein the divided pixels which are adjacent to each other in the first direction and the second direction are allocated to become different pixels for L and R in stereo.

(7) The solid-state imaging device according to (4),
wherein the divided pixels are formed so that the pixels for L in stereo correspond to the high sensitivity or the low sensitivity and the pixels for R in stereo correspond to the low sensitivity or the high sensitivity in the same row, and so that the pixels for L in stereo correspond to the low sensitivity or the high sensitivity and the pixels for R in stereo correspond to the high sensitivity or the low sensitivity in an adjacent row, in the matrix-formed arrangement of the color pixels.

(8) The solid-state imaging device according to any one of (2) to (7),
wherein the pixel array section includes a color filter array which is disposed on a light receiving section, and an on-chip lens array which is formed on the color filter array to correspond to each divided pixel,
wherein the multi-lens array is disposed on a light incident side of the on-chip lens array, and
wherein in the multi-lenses and on-chip lenses, pupil correction is performed according to change in an optical axis.

(9) A camera system including:
a solid-state imaging device; and
an optical system which forms an object image on the solid-state imaging device, wherein the solid-state imaging device includes a pixel array section in which a plurality of color pixels are arranged in a matrix form in a first direction and a second direction which is perpendicular to the first direction, and a multi-lens array in which multi lenses which allow light to be incident on the plurality of color pixels are arranged, wherein in the respective color pixels of the pixel array section, color pixels adjacent in at least one direction of the first direction and the second direction are allocated to a pixel for L in stereo and a pixel for R in stereo, and wherein the multi-lens array is disposed so that at least part of the multi-lens array allows the light to be incident on the adjacent color pixels which are different in color in the first direction.

(10) The camera system according to (9), wherein the plurality of adjacent color pixels or one color pixel of the pixel array section includes a plurality of divided pixels which are regions whose light sensitivities or amounts of accumulated charges are different from each other, wherein the respective divided pixels are allocated to the pixel for L in stereo and the pixel for R in stereo, and wherein the multi-lens array is disposed so that at least part of the multi-lens array allows the light to be incident on the adjacent color divided pixels which are different in color in the first direction.

(11) The camera system according to (10), wherein the plurality of divided pixels are formed in at least the first direction, and wherein the adjacent divided pixels are allocated to the pixel for L in stereo and the pixel for R in stereo.

(12) The camera system according to (11), wherein the color pixels include the plurality of divided pixels which are arranged in a square shape in the first direction and the second direction, and wherein the color pixels are formed so that the color pixels of low sensitivity and the color pixels of high sensitivity are alternately arranged in respective rows of the matrix-formed arrangement of the color pixels.

(13) The camera system according to (11) or (12), wherein the divided pixels are allocated to become the same pixels for L or R in stereo in the same column and are allocated to become the same pixels for R or L in stereo in an adjacent column, in the matrix-formed arrangement of the color pixels.

(14) The camera system according to (12), wherein the divided pixels which are adjacent to each other in the first direction and the second direction are allocated to become different pixels for L and R in stereo.

(15) The camera system according to (12), wherein the divided pixels are formed so that the pixels for L in stereo correspond to the high sensitivity or the low sensitivity and the pixels for R in stereo correspond to the low sensitivity or the high sensitivity in the same row, and so that the pixels for L in stereo correspond to the low sensitivity or the high sensitivity and the pixels for R in stereo correspond to the high sensitivity or the low sensitivity in an adjacent row, in the matrix-formed arrangement of the color pixels.

(16) The camera system according to any one of (10) to (15), wherein the pixel array section includes a color filter array which is disposed on a light receiving section, and an on-chip lens array which is formed on the color filter array to correspond to each divided pixel, wherein the multi-lens array is disposed on a light incident side of the on-chip lens array, and wherein in the multi-lenses and on-chip lenses, pupil correction is performed according to change in an optical axis.

The present disclosure contains subject matter related to those disclosed in Japanese Priority Patent Applications JP 2011-043232 and JP 2011-115379 filed in the Japan Patent Office on Feb. 28, 2011 and May 24, 2011, respectively, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 10, 10A to 10H SOLID-STATE IMAGING DEVICE (CMOS IMAGE SENSOR)
11 SEMICONDUCTOR SUBSTRATE (SENSOR CHIP)
12 PIXEL ARRAY SECTION
13 VERTICAL DRIVING SECTION
14 COLUMN PROCESSING SECTION
15 HORIZONTAL DRIVING SECTION
16 SYSTEM CONTROL SECTION
20 UNIT PIXEL
21 PHOTODIODE
22 TRANSFER TRANSISTOR
23 RESET TRANSISTOR
24 AMPLIFICATION TRANSISTOR
25 SELECTION TRANSISTOR
26 FD (FLOATING DIFFUSION) SECTION
31 DSP CIRCUIT
32 IMAGE MEMORY
33 COLOR FILTER ARRAY
34 MULTI-LENS ARRAY
OCL ON-CHIP LENS
ML, ML1, ML2 MULTI-LENS
DPC-A to DPC-D DIVIDED PIXEL
200 CAMERA SYSTEM
210 IMAGING DEVICE
220 LENS
230 DRIVE CIRCUIT
240 SIGNAL PROCESSING CIRCUIT

The invention claimed is:

1. A solid-state imaging device comprising:
a pixel array section including a plurality of color pixels arranged in a first matrix form in a first direction and a second direction which is perpendicular to the first direction; and
a multi-lens array including a plurality of multi-lenses arranged in a second matrix form in the first direction and the second direction, respective ones of the plurality of multi-lenses are configured to allow light to be incident on adjacent color pixels of the plurality of color pixels in only one of the first direction or the second direction,
wherein color pixels of the plurality of color pixels that are adjacent in at least one direction of the first direction and the second direction are allocated to a pixel for L in stereo and a pixel for R in stereo, and
wherein the multi-lens array is disposed so that at least a part of the multi-lens array allows the light to be incident on the adjacent color pixels which are different in color from one another in the first direction.

2. The solid-state imaging device according to claim 1,
wherein at least one of the plurality of color pixels includes a plurality of divided pixels which are regions whose light sensitivities or amounts of accumulated charges are different from each other,
wherein respective ones of the plurality of divided pixels are allocated to the pixel for L in stereo and the pixel for R in stereo, and
wherein the multi-lens array is disposed so that the light is incident on different color divided pixels at least a part of which have different colors in the first direction.

3. The solid-state imaging device according to claim 2,
wherein the plurality of divided pixels are arranged in at least the first direction, and
wherein adjacent divided pixels of the plurality of divided pixels are allocated to the pixel for L in stereo and the pixel for R in stereo.

4. The solid-state imaging device according to claim 3,
wherein the plurality of divided pixels that are part of one or more corresponding color pixels are arranged in a square shape in the first direction and the second direction, and
wherein the plurality of color pixels are arranged so that first respective divided pixels of the plurality of divided pixels have a low sensitivity and second respective divided pixels of the plurality of divided pixels have a high sensitivity, and
wherein the first respective divided pixels and the second respective divided pixels are alternately arranged in respective rows of the first matrix form of the plurality of color pixels.

5. The solid-state imaging device according to claim 4,
wherein the plurality of divided pixels are allocated to become the same pixels for L or R in stereo in the same column and are allocated to become the same pixels for R or L in stereo in an adjacent column, in the first matrix form of the color pixels.

6. The solid-state imaging device according to claim 4,
wherein the plurality of divided pixels that are adjacent to each other in the first direction and the second direction are allocated to become different pixels for L and R in stereo.

7. The solid-state imaging device according to claim 4,
wherein the plurality of divided pixels are formed so that the pixel for L in stereo correspond to the high sensitivity or the low sensitivity and the pixel for R in stereo correspond to the low sensitivity or the high sensitivity in the same row, and so that the pixel for L in stereo correspond to the low sensitivity or the high sensitivity and the pixel for R in stereo correspond to the high sensitivity or the low sensitivity in an adjacent row, in the first matrix form of the color pixels.

8. The solid-state imaging device according to claim 2,
wherein the pixel array section includes a color filter array disposed on a light receiving section, and an on-chip lens array formed on the color filter array to correspond to each divided pixel,
wherein the multi-lens array is disposed on a light incident side of the on-chip lens array, and
wherein in the plurality of multi-lenses and on-chip lenses of the on-chip lens array, pupil correction is performed according to change in an optical axis.

9. The solid-state imaging device according to claim 1,
wherein the first matrix form is different from the second matrix form.

10. A camera system comprising:
a solid-state imaging device; and
an optical system configured to form an object image on the solid-state imaging device,
wherein the solid-state imaging device includes a pixel array section including a plurality of color pixels arranged in a first matrix form in a first direction and a second direction which is perpendicular to the first direction, and a multi-lens array including a plurality of multi-lenses arranged in a second matrix form in the first direction and the second direction, respective ones of the plurality of multi-lenses are configured to allow light to be incident on adjacent color pixels the plurality of color pixels in only one of the first direction or the second direction,
wherein in the respective color pixels of the pixel array section, the color pixels adjacent in at least one direction of the first direction and the second direction are allocated to a pixel for L in stereo and a pixel for R in stereo, and
wherein the multi-lens array is disposed so that at least part of the multi-lens array allows the light to be incident on the adjacent color pixels which are different in color from one another in the first direction.

11. The camera system according to claim 10,
wherein at least one of the plurality of color pixels includes a plurality of divided pixels which are regions whose light sensitivities or amounts of accumulated charges are different from each other,
wherein the respective divided pixels are allocated to the pixel for L in stereo and the pixel for R in stereo, and
wherein the multi-lens array is disposed so that at least part of the multi-lens array allows the light to be incident on the plurality of divided pixels of the adjacent color pixels which are different in color in the first direction.

12. The camera system according to claim 11,
wherein the plurality of divided pixels are arranged in at least the first direction, and
wherein adjacent divided pixels of the plurality of divided pixels are allocated to the pixel for L in stereo and the pixel for R in stereo.

13. The camera system according to claim 12,
wherein the plurality of divided pixels that are part of one or more corresponding color pixels are arranged in a square shape in the first direction and the second direction, and
wherein the plurality of color pixels are arranged so that first respective divided pixels of the plurality of divided pixels have a low sensitivity and second respective divided pixels of the plurality of divided pixels have a high sensitivity, and
wherein the first respective divided pixels and the second respective divided pixels are alternately arranged in respective rows of the first matrix form of the plurality of color pixels.

14. The camera system according to claim 13,
wherein the divided pixels are allocated to become the same pixels for L or R in stereo in the same column and are allocated to become the same pixels for R or L in stereo in an adjacent column, in the first matrix form of the color pixels.

15. The camera system according to claim 13,
wherein the divided pixels which are adjacent to each other in the first direction and the second direction are allocated to become different pixels for L and R in stereo.

16. The camera system according to claim 13,
wherein the divided pixels are formed so that the pixel for L in stereo correspond to the high sensitivity or the low sensitivity and the pixel for R in stereo correspond to the low sensitivity or the high sensitivity in the same row, and so that the pixel for L in stereo correspond to the low sensitivity or the high sensitivity and the pixel for R in stereo correspond to the high sensitivity or the low sensitivity in an adjacent row, in the first matrix form of the color pixels.

17. The camera system according to claim 11,
wherein the pixel array section includes a color filter array disposed on a light receiving section, and an on-chip lens array formed on the color filter array to correspond to each divided pixel,
wherein the multi-lens array is disposed on a light incident side of the on-chip lens array, and
wherein in the plurality of multi-lenses and on-chip lenses of the on-chip lens array, pupil correction is performed according to change in an optical axis.

18. The camera system according to claim 10,
wherein the first matrix form is different from the second matrix form.

\* \* \* \* \*